(12) United States Patent
Thibaut

(10) Patent No.: US 11,617,281 B2
(45) Date of Patent: Mar. 28, 2023

(54) RACK ADAPTED FOR RECEIVING A COMPONENT, SYSTEM INCLUDING THE RACK AND THE COMPONENT AND METHOD OF DELIVERING POWER TO A COMPONENT MOUNTED IN A RACK

(71) Applicant: OVH, Roubaix (FR)

(72) Inventor: Christophe Maurice Thibaut, Houplin Ancoisne (FR)

(73) Assignee: OVH, Roubaix (FR)

( * ) Notice: Subject to any disclaimer, the term of this patent is extended or adjusted under 35 U.S.C. 154(b) by 275 days.

(21) Appl. No.: 16/780,411

(22) Filed: Feb. 3, 2020

(65) Prior Publication Data

US 2020/0260608 A1 Aug. 13, 2020

(30) Foreign Application Priority Data

Feb. 13, 2019 (EP) ..................................... 19315006

(51) Int. Cl.
*G06F 1/00* (2006.01)
*H05K 7/14* (2006.01)
(Continued)

(52) U.S. Cl.
CPC ............ *H05K 7/1457* (2013.01); *G06F 1/28* (2013.01); *H02H 7/20* (2013.01); *H05K 7/1439* (2013.01);
(Continued)

(58) Field of Classification Search
CPC ................................ H05K 7/1457; G06F 1/28
See application file for complete search history.

(56) References Cited

U.S. PATENT DOCUMENTS

| 4,477,862 A | 10/1984 | Gonzales |
| 5,280,229 A | 1/1994 | Faude et al. |

(Continued)

FOREIGN PATENT DOCUMENTS

| CN | 1507685 A | 6/2004 |
| CN | 101341810 A | 1/2009 |

(Continued)

OTHER PUBLICATIONS

Notice of Allowance with regard to the counterpart U.S. Appl. No. 16/690,344 dated Mar. 10, 2021.

(Continued)

*Primary Examiner* — Mohammed H Rehman
(74) *Attorney, Agent, or Firm* — BCF LLP

(57) ABSTRACT

A rack adapted for receiving a component, a system including the rack and the component and a method of delivering power to the component mounted in the rack are disclosed. The rack comprises a backplane, a power panel, and a main controller. Each stage of the backplane includes a backplane power connector and a backplane data connector that are respectively connectable to a component power connector and to a component data connector when the component is inserted in the backplane stage. The main controller detects an insertion of the component in a given backplane stage by receiving a signal emitted by the backplane data connector of that backplane stage, acquires a set of power parameters of the component, and causes the power panel to provide power to the backplane power connector of that backplane stage according to the set of power parameters of the component.

13 Claims, 28 Drawing Sheets

(51) Int. Cl.
*G06F 1/28* (2006.01)
*H02H 7/20* (2006.01)

(52) U.S. Cl.
CPC ......... *H05K 7/1459* (2013.01); *H05K 7/1489* (2013.01); *H05K 7/1492* (2013.01)

(56) References Cited

U.S. PATENT DOCUMENTS

| | | | |
|---|---|---|---|
| 5,297,009 A | 3/1994 | Gelez et al. | |
| 6,144,561 A | 11/2000 | Cannella et al. | |
| 6,822,874 B1 | 11/2004 | Marler | |
| 6,836,407 B2 | 12/2004 | Faneuf et al. | |
| 7,132,833 B2 | 11/2006 | Layden et al. | |
| 7,480,138 B2 | 1/2009 | Kogan et al. | |
| 7,562,779 B2 | 7/2009 | Bravo et al. | |
| 7,661,545 B2 | 2/2010 | Hardy et al. | |
| 8,009,438 B2 * | 8/2011 | Leigh | H05K 1/144 361/788 |
| 9,019,706 B2 | 4/2015 | Ning et al. | |
| 9,295,169 B1 | 3/2016 | Spinner et al. | |
| 9,343,916 B2 | 5/2016 | Emslie | |
| 10,164,373 B1 | 12/2018 | Cheon et al. | |
| 2002/0067601 A1 | 6/2002 | Hsu et al. | |
| 2002/0141544 A1 * | 10/2002 | Brown | H04W 52/18 379/1.01 |
| 2002/0179549 A1 | 12/2002 | Felcman et al. | |
| 2004/0057211 A1 | 3/2004 | Kondo et al. | |
| 2005/0270751 A1 | 12/2005 | Coglitore et al. | |
| 2006/0203460 A1 | 9/2006 | Aviv | |
| 2006/0274508 A1 | 12/2006 | Lariviere et al. | |
| 2008/0114865 A1 * | 5/2008 | Rothman | H04W 4/02 709/223 |
| 2010/0176762 A1 | 7/2010 | Daymude et al. | |
| 2010/0268802 A1 * | 10/2010 | Lipps | H04L 41/0695 709/220 |
| 2011/0075349 A1 | 3/2011 | Ma et al. | |
| 2011/0134601 A1 | 6/2011 | Sa | |
| 2011/0193524 A1 | 8/2011 | Hazzard et al. | |
| 2011/0289327 A1 | 11/2011 | Nolterieke et al. | |
| 2011/0308783 A1 | 12/2011 | Nicewonger | |
| 2011/0313576 A1 | 12/2011 | Nicewonger | |
| 2013/0102237 A1 | 4/2013 | Zhou et al. | |
| 2014/0062390 A1 | 3/2014 | Webber | |
| 2014/0277784 A1 | 9/2014 | Mick et al. | |
| 2015/0208551 A1 | 7/2015 | Davidson | |
| 2015/0362691 A1 | 12/2015 | Montgelas et al. | |
| 2016/0066480 A1 | 3/2016 | Eckberg et al. | |
| 2016/0205800 A1 | 7/2016 | Roberts | |
| 2016/0381834 A1 | 12/2016 | Harvilchuck et al. | |
| 2017/0027068 A1 | 1/2017 | Dane et al. | |
| 2017/0027079 A1 | 1/2017 | Dombrowski et al. | |
| 2017/0047751 A1 | 2/2017 | Fernandes | |
| 2017/0127575 A1 | 5/2017 | Lunsman et al. | |
| 2017/0164500 A1 | 6/2017 | Van et al. | |
| 2017/0359918 A1 | 12/2017 | Klaba et al. | |
| 2018/0014433 A1 | 1/2018 | Klein | |
| 2018/0150240 A1 | 5/2018 | Bernat et al. | |
| 2018/0151975 A1 | 5/2018 | Aoki | |
| 2018/0231295 A1 | 8/2018 | Akiyama et al. | |
| 2018/0241244 A1 * | 8/2018 | Stevens | H02J 9/06 |
| 2019/0138064 A1 | 5/2019 | Abali et al. | |
| 2020/0103955 A1 * | 4/2020 | Lee | G06F 1/3206 |
| 2020/0201408 A1 * | 6/2020 | Lehwalder | G06F 1/28 |
| 2020/0210367 A1 * | 7/2020 | Jabori | G06F 13/4282 |

FOREIGN PATENT DOCUMENTS

| | | | | |
|---|---|---|---|---|
| CN | 102129274 A | 7/2011 | | |
| CN | 102480432 A | 5/2012 | | |
| CN | 103138942 A | 6/2013 | | |
| CN | 104808542 A | 7/2015 | | |
| CN | 104977998 A | 10/2015 | | |
| CN | 105993099 A | 10/2016 | | |
| CN | 107819228 A | 3/2018 | | |
| EP | 0990377 A1 | 4/2000 | | |
| EP | 3364736 A1 | 8/2018 | | |
| WO | 9856223 A1 | 12/1998 | | |
| WO | WO-2019050514 A1 * | 3/2019 | ......... | G06F 13/1668 |

OTHER PUBLICATIONS

'Charging Station', Bamboo Deluxe Charging Station, https://www.lipperinternational.com/, https://www.lipperinternational.com/products/bamboo-deluxe-charging-station/, accessed on Nov. 20, 2019, pdf 4 pages.
Extended European Search Report with regard to EP Patent Application No. 18315047.3 dated Sep. 2, 2019.
Partial European Search Report with regard to EP Patent Application No. 18315047.3 dated May 22, 2019.
Extended European Search Report with regard to EP Patent Application No. 19315006.7 dated Jul. 31, 2019.
Office Action with regard to the counterpart CN Patent Application No. 201911199888.5 dated Jan. 4, 2022.
English Abstract for CN105993099 retrieved on Espacenet on Jan. 24, 2022.
English Abstract for CN107819228 retrieved on Espacenet on Jan. 24, 2022.
English Abstract for CN104808542 retrieved on Espacenet on Jan. 24, 2022.
Notification of Grant with regard to the counterpart CN Patent Application No. 202010090628.0 dated Mar. 22, 2022.
English Abstract for CN102129274 retrieved on Espacenet on Apr. 6, 2022.
English Abstract for CN101341810 retrieved on Espacenet on Apr. 6, 2022.
English Abstract for CN104977998 retrieved on Espacenet on Apr. 6, 2022.
English Abstract for CN102480432 retrieved on Espacenet on Apr. 6, 2022.
English Abstract for CN103138942 retrieved on Espacenet on Apr. 6, 2022.
English Abstract for CN1507685 retrieved on Espacenet on Apr. 6, 2022.
Office Action with regard to the counterpart U.S. Appl. No. 17/344,302 dated Mar. 24, 2022.
Office Action with regard to the U.S. Appl. No. 17/727,312 dated Jan. 24, 2023.

* cited by examiner

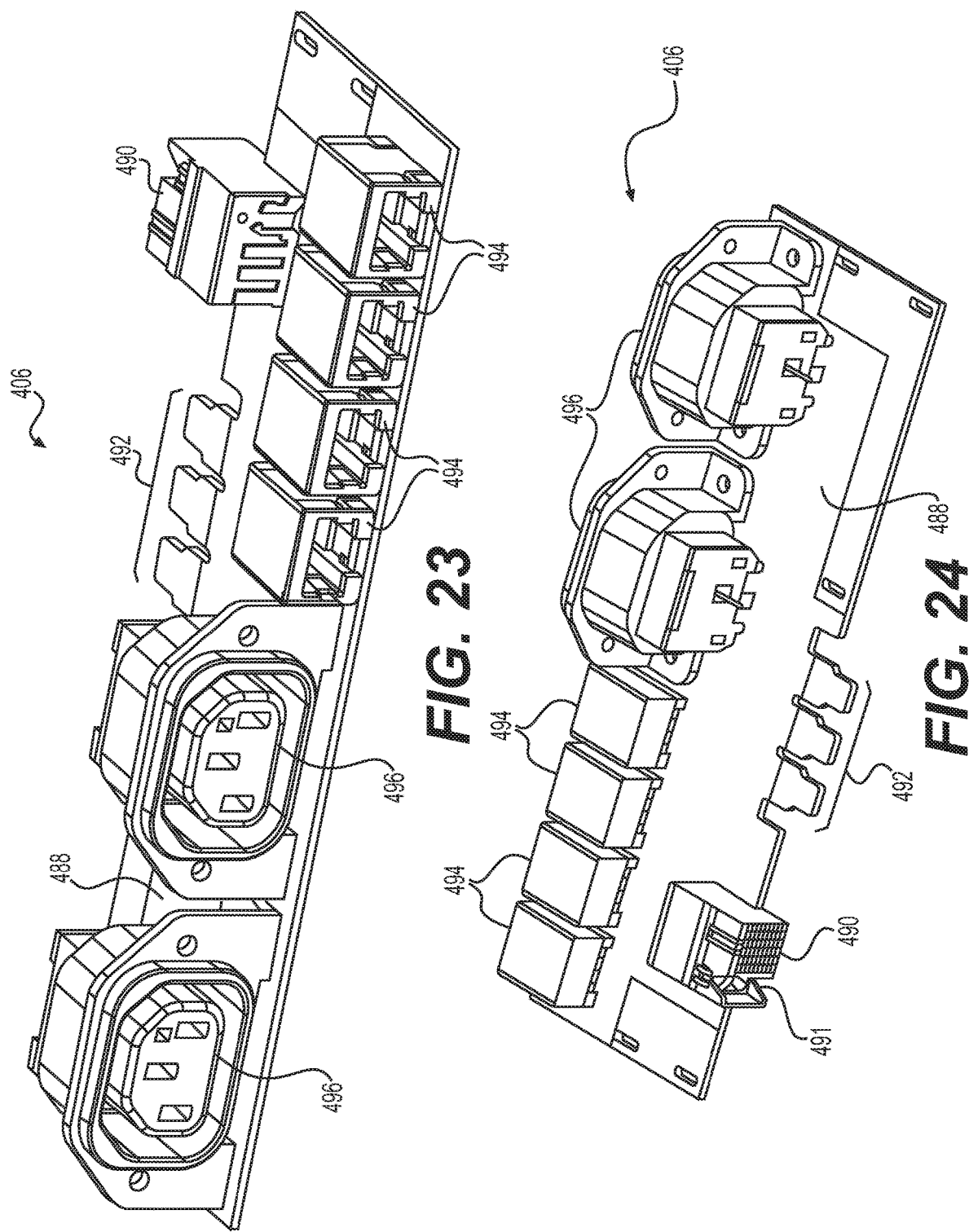

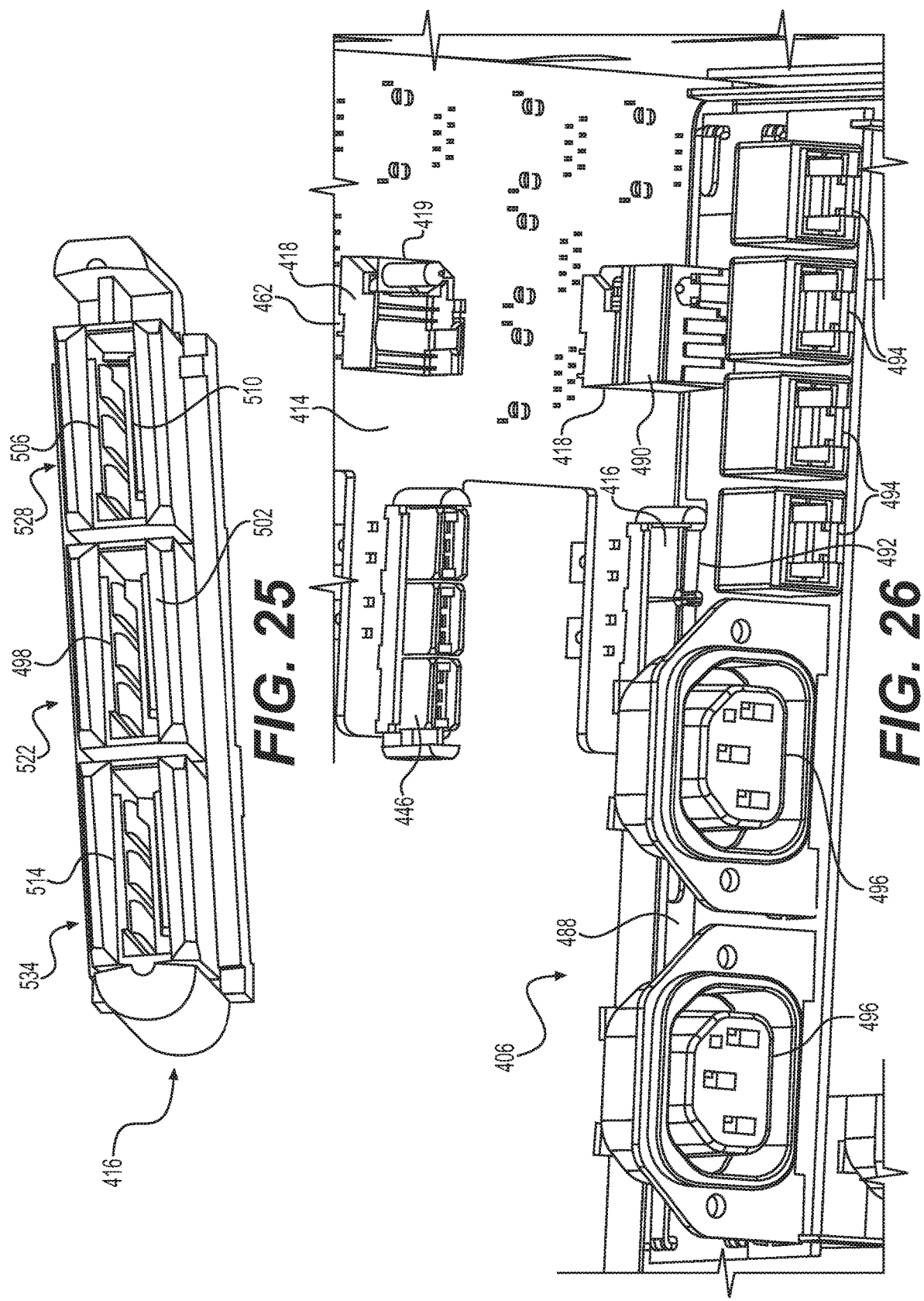

RACK ADAPTED FOR RECEIVING A COMPONENT, SYSTEM INCLUDING THE RACK AND THE COMPONENT AND METHOD OF DELIVERING POWER TO A COMPONENT MOUNTED IN A RACK

CROSS-REFERENCE

The present application claims priority from European Patent Application no. 19315006.7, filed on Feb. 13, 2019, the disclosure of which is incorporated by reference herein.

FIELD

The present technology relates to enclosures adapted to receive and provide power to electronic equipment. In particular, a rack adapted for receiving a component, a system including the rack and the component and a method of delivering power to a component mounted in a rack are disclosed.

BACKGROUND

Electronic devices, for example servers, memory banks, computer discs, and the like, are conventionally mounted one above the other in equipment racks. Some components, for example motherboards, have non-standard form factors and are smaller than conventional rack components. These components cannot be mounted in standard racks without proper adaptation. Various cables are connected to each component inserted in a rack. Some cables carry input and/or output data and signalling. Other cables provide electrical power to the components, in AC or DC form, according to the needs of a particular component. Conventionally, these cables are mounted on the front of the rack, i.e. on the front of the components. In a large rack, the number of cables may be high and lead to potential installation errors or maintenance errors.

These problems are particularly significant in large data centers that may contain thousands or even tens of thousands of servers. New servers may be added on a daily basis. Some servers may fail and need to be replaced from time to time. Complex cabling, variability of power requirements and variability of component sizes cause difficulties in the provisioning and maintenance of large data centers. Installation and removal of components in equipment racks is a daily routine task for operators. Care must be taken to properly align components within equipment racks. When installed in haste, components may be improperly aligned in their racks, leading to equipment failure or to bad electrical and/or data connections. Consequently, installation of components in equipment racks is a delicate and time-consuming operation.

The racks, including equipment mounted in their backplanes, consume large amounts of electric power and generate significant amounts of heat. Cooling needs are important in such racks. Water-cooling may be used, but is difficult to provision in an efficient way. The need for hydraulic connections to be fully watertight is self-evident given the presence of electronic equipment.

Improvements are still desirable in the maintenance and provisioning of large data centers.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art.

In particular, such shortcomings may comprise (1) cabling complexity, (2) variability of electrical power requirements, and/or (3) variability of component form factors.

In one aspect, various implementations of the present technology provide a rack adapted for receiving a component, comprising:
  a backplane having a plurality of backplane stages, each backplane stage including a backplane power connector and a backplane data connector, the backplane power connector and the backplane data connector being respectively connectable to a component power connector and to a component data connector of the component when the component is inserted in the backplane stage;
  a power panel; and
  a main controller operatively connected the power panel and to the backplane data connector of each of the plurality of backplane stages, the main controller being configured to:
    detect an insertion of the component in a given one of the plurality of backplane stages by receiving a signal emitted by the backplane data connector of the given backplane stage when the backplane data connector of the given backplane stage is connected to the component data connector,
    acquire a set of power parameters of the component via the backplane data connector of the given backplane stage, and
    cause the power panel to provide power to the backplane power connector of the given backplane stage according to the set of power parameters of the component.

In some implementations of the present technology, the power panel comprises a plurality of power stages, each power stage being electrically connected to the backplane power connector of a corresponding backplane stage; the main controller is operatively connected to each of the power stages of the power panel; and the main controller is further configured to cause the power panel to provide power to the backplane power connector of the given backplane stage via the power stage electrically connected to the given backplane stage by: sending a presence verification signal to a power control device connected to the power stage electrically connected to the given backplane stage; receiving a presence confirmation signal from the power control device; and sending a power-on signal to the power control device.

In some implementations of the present technology, each of the power stages of the power panel comprises two complementary power connectors that are both connected to the backplane power connector of the corresponding backplane stage, each of the two complementary power connectors being adapted to receive a corresponding power control device; and a first one of the complementary power connectors is fed by a first power line and a second one of the complementary power connectors is fed by a second power line.

In some implementations of the present technology, the main controller is further configured to: read in the set of power parameters of the component an information element indicating whether the component specifies a single or dual power supply; cause the power panel to provide power to the backplane power connector of the given backplane stage via one of the complementary power connectors of the power stage corresponding to the given backplane stage if the component specifies a single power supply; cause the power panel to provide power to the backplane power connector of the given backplane stage via both of the complementary power connectors of the power stage corresponding to the given backplane stage if the component specifies a dual power supply; read in the set of power parameters of the component an expected power consumption of the component; obtain from the power stage connected to the given backplane stage a measured power consumption of the component; and issue a warning signal if the measured power consumption of the component is higher or lower than the expected power consumption of the component by more than a predetermined threshold.

In some implementations of the present technology, the main controller is further configured to obtain the measured power consumption of the component following a predetermined delay after causing the power panel to provide power to the backplane power connector of the given backplane stage.

In other aspects, various implementations of the present technology provide a system, comprising the component and the rack adapted for receiving the component, the component comprising:

a main board, a midplane mounted on the main board, the component power connector and the component data connector being mounted on the midplane, and a memory operatively connected to the component data connector, the memory storing the set of power parameters of the component.

In some implementations of the present technology, component further comprises: an electric plug mounted on the midplane and electrically connected to the component power connector; a data plug mounted on the midplane and operatively connected to the component data connector; and an electronic device mounted on the main board and connected to the electric plug and to the data plug.

In some implementations of the present technology, the rack is adapted for insertion of standard-size boards; the main board is a standard-size board; and the electronic device comprises a non-standard-size board mounted on the main board.

In some implementations of the present technology, the rack comprises a plurality of distinct rack stages adapted for receiving distinct components, each distinct rack stage corresponding to one of the backplane stages and to the power stage corresponding to the one of the backplane stages; and the main controller is further configured to cause the power panel to independently provide power to each of the distinct components being inserted in the distinct rack stages according to distinct sets of power parameters of the distinct components acquired via distinct data connectors of distinct backplane stages corresponding to the distinct rack stages in which the distinct components are inserted.

In some implementations of the present technology, the system further comprises a modem operatively connected to the main controller and to a power line providing power to the power panel, the main controller being further configured to: obtain from the power stage distinct power consumption measurements for the distinct components inserted in the distinct rack stages; assemble the distinct power consumption measurements to form a power consumption mapping for the rack; and cause the modem to transmit the power consumption mapping over the power line.

In further aspects, various implementations of the present technology provide a method for providing power to a component received in a rack, comprising:

detecting an insertion of the component in a given stage of the rack by receiving, at a main controller, a signal from a backplane data connector of the given stage of the rack, the insertion of the component establishing a contact between the backplane data connector in the given stage of the rack and a component data connector of the component;

acquiring a set of power parameters of the component via the backplane data connector in the given stage of the rack; and causing a power panel to provide power to a backplane power connector in the given stage of the rack according to the set of power parameters of the component.

In some implementations of the present technology, causing the power panel to provide power to the backplane power connector in the given stage of the rack further comprises: sending, from the main controller, a presence verification signal to a power control device connected to a given power stage of the power panel, the given power stage of the power panel being electrically connected to the backplane power connector in the given stage of the rack; receiving, at the main controller, a presence confirmation signal from the power control device; and sending, from the main controller, a power-on signal to the power control device.

In some implementations of the present technology, the method further comprises issuing a warning signal if the main controller does not receive the presence confirmation signal from the power control device.

In some implementations of the present technology, the method further comprises reading in the set of power parameters of the component an expected power consumption of the component; obtaining from the given power stage a measured power consumption of the component; and issuing a warning signal if the measured power consumption of the component is higher or lower than the expected power consumption of the component by more than a predetermined threshold.

In some implementations of the present technology, the method further comprises issuing a warning signal if the power control device detects that the component does not consume power.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where:

FIG. 23 is a front perspective view of a midplane in accordance with an embodiment of the present technology;

FIG. 24 is a rear perspective view of the midplane of FIG. 23 in accordance with an embodiment of the present technology;

FIG. 25 is a detailed view of a backplane power connector mounted on a backplane;

FIG. 26 is a perspective detailed view showing a connection of the midplane to the backplane in accordance with an embodiment of the present technology;

Figure 1:
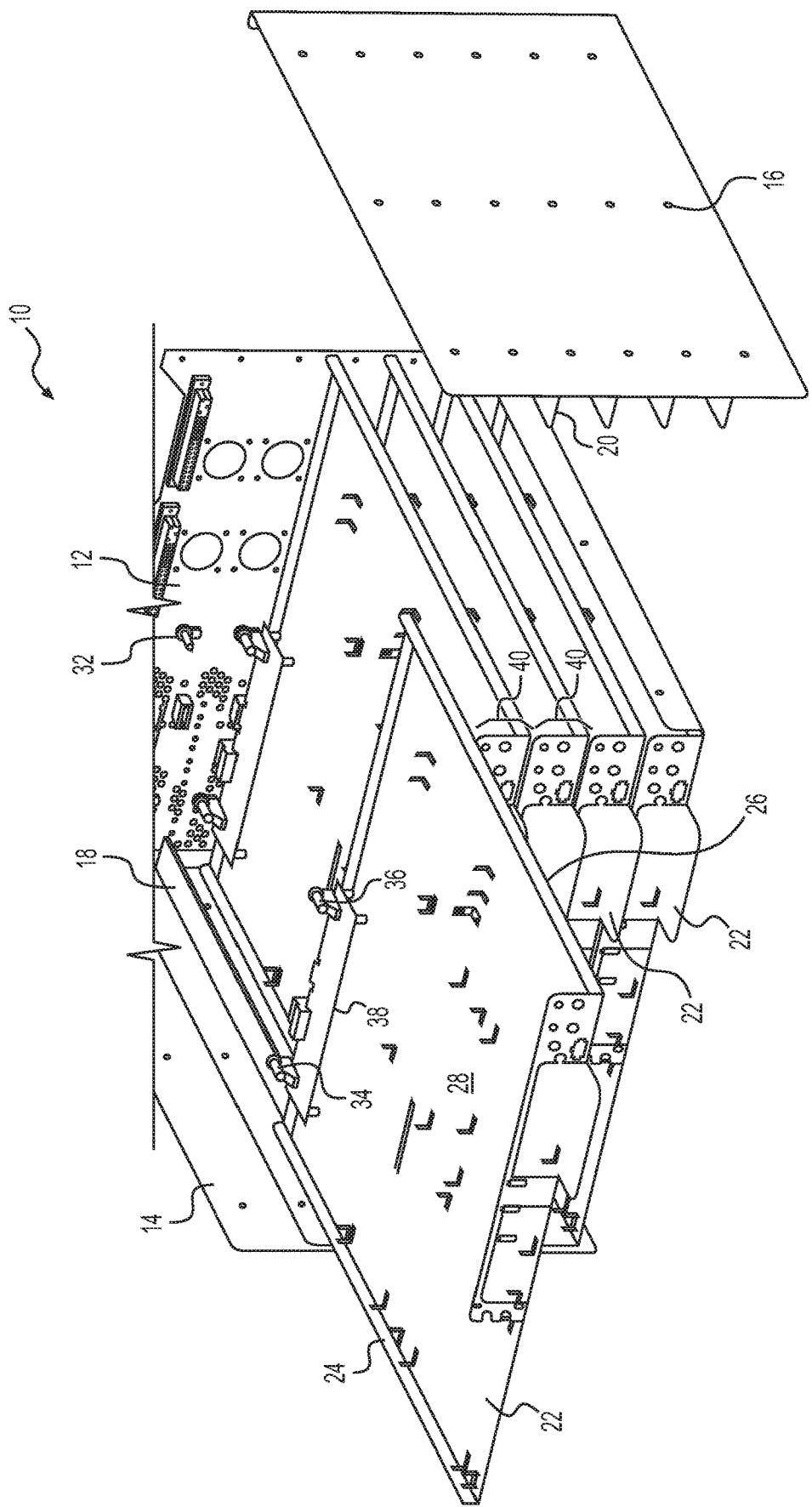
FIG. 1 is a perspective, exploded view of a rack in accordance with an embodiment of the present technology.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes that may be substantially represented in computer-readable media and so executed by a computer or processor, whether or not such computer or processor is explicitly shown.

The functions of the various elements shown in the figures, including any functional block labeled as a "processor", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general-purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown. Moreover, it should be understood that module may include for example, but without being limitative, computer program logic, computer program instructions, software, stack, firmware, hardware circuitry or a combination thereof which provides the required capabilities.

With these fundamentals in place, we will now consider some non-limiting examples to illustrate various implementations of aspects of the present technology.

The present technology allows to efficiently mount equipment in a rack, including without limitation servers, data storage solutions, and the like. In at least one variant, fluidic connections may be included for the provision of liquid cooling. The present technology also allows to electrically connect, to protect, to monitor and to provide network connectivity to various types of equipment mounted in such racks. Power line communication (PLC) capabilities may also be provided to the equipment mounted in the rack.

In one aspect, the present technology introduces a component insertable in a rack that includes a pair of female connectors that come in alignment with a pair of male connectors located in the backplane of the rack when the component is inserted. Small components having non-standard form factors are mounted on conventionally sized boards that provide interconnection between the small components and the male connectors as well as with any component located beyond the rack. The rack includes mechanical guides to generally locate the insertable components. The female connectors of a given insertable component and the male connectors in the backplane of the rack are positioned so that, in a first time when the given component is at least partially inserted in the rack and the rear end of the given component is placed near the backplane, precise mechanical alignment of the given component is provided by partial and then full insertion of the male connectors in the female connectors.

In a second time, when the given component is fully inserted in the rack, the male connectors being fully inserted in the female connectors, AC or DC power is delivered to the given component via the connection between the male and female connectors. Electrical power is delivered via the backplane of the rack where the male connectors are located so the number of cables mounted at the front of the rack is reduced.

In an embodiment, a plurality of pairs of male connectors are mounted in the backplane, each pair being vertically separated from a next pair by a typical height of the insertable components so that plural insertable components can be received in this manner in the rack and are powered in this manner External logic may control initiation of the AC or DC power provision to the inserted components. Both AC and DC power can be supported in the same rack. The external logic may receive measurements (voltages, current, power, power phase) for the rack in view of providing statistical information about power consumption. It becomes possible to plan the evolution of power consumption as numerous racks and components are added. More male/female connectors may be used, for example for redundancy purposes.

In the same or another embodiment, fluidic connections for the supply of liquid cooling in the backplane of the rack are provided. In addition to the above described rack and component, a liquid adaptor is mounted on the component. The liquid adaptor includes a feed port and a return port that are respectively meant for mating with an inlet port and an outlet port in the backplane of the rack. An elongate rod part of the liquid adaptor has an end section that penetrates in a slot of the backplane. Rotating the elongate rod locks the component in place against the backplane, within the rack. In a variant, the inlet and outlet ports may supplement the male adaptors and the feed and return ports may be provided in addition to the female adaptors. In another variant, the inlet and outlet ports may form one or both of the male adaptors and the feed and return ports may form one or both of the female adaptors.

Another embodiment that may or may not integrate some of the above-described embodiments comprises a rack having a backplane, a power panel and a main controller. The backplane has a plurality of stages that each includes a power connector and a data connector. A component may be received in a stage of the rack so that its own power and data connectors come in contact with the power and data connectors of the corresponding backplane stage. The main controller is informed of the insertion of the component by the data connector of the backplane. The main controller also receives a set of power parameters of the component from the data connector of the backplane. The main controller causes the power panel to provide power to the backplane power connector of the backplane stage according to the set of power parameters of the component.

In the present specification, the term rack should be understood as synonymous with enclosure, chassis, cabinet and similar terms. The term system may encompass a combination of elements, including without limitation a rack and a component inserted in the rack.

Figure 2:
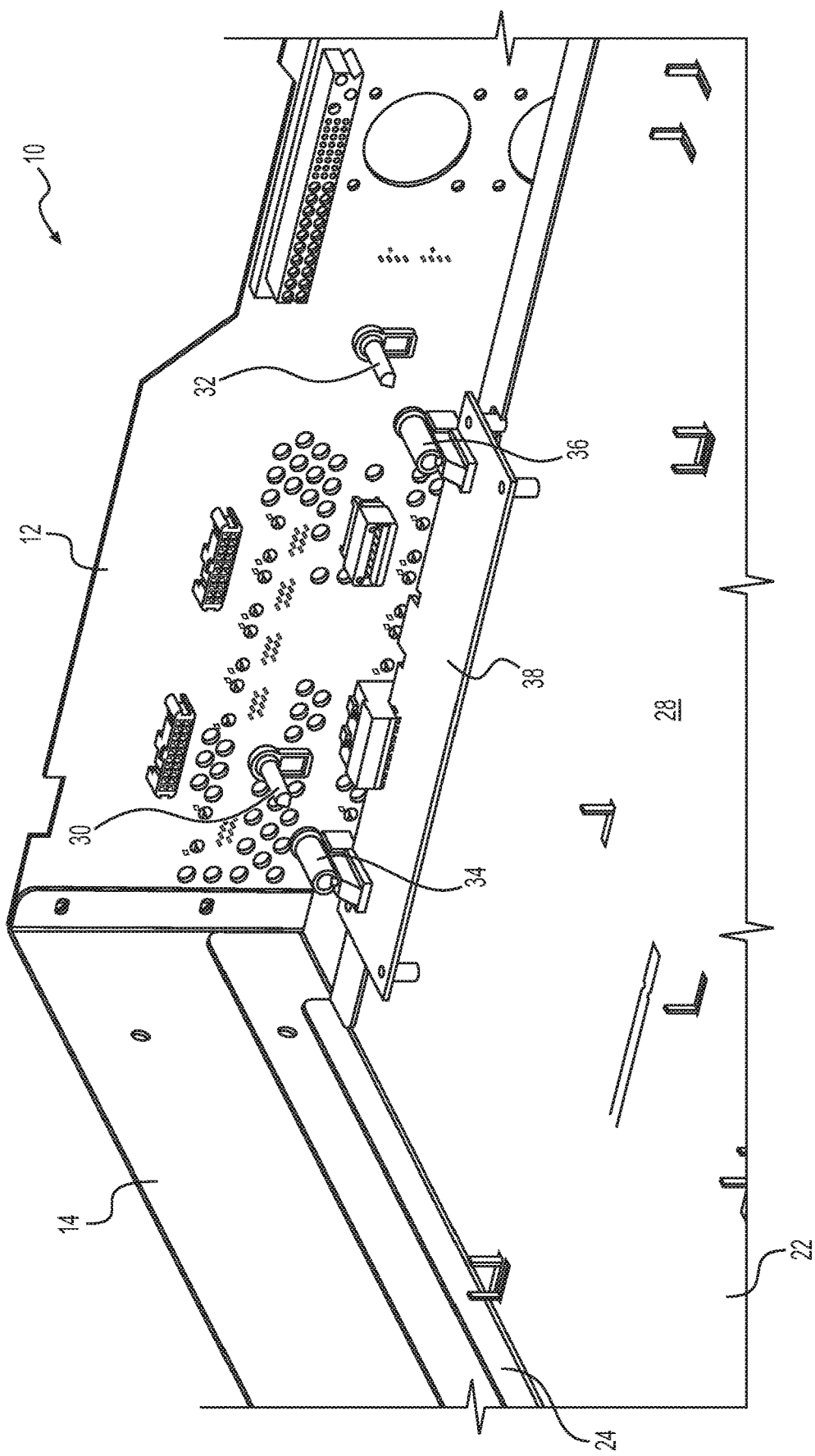
FIG. 2 is a perspective, detailed view of the rack of FIG. 1 with a partially inserted component in accordance with an embodiment of the present technology.
Figure 3:
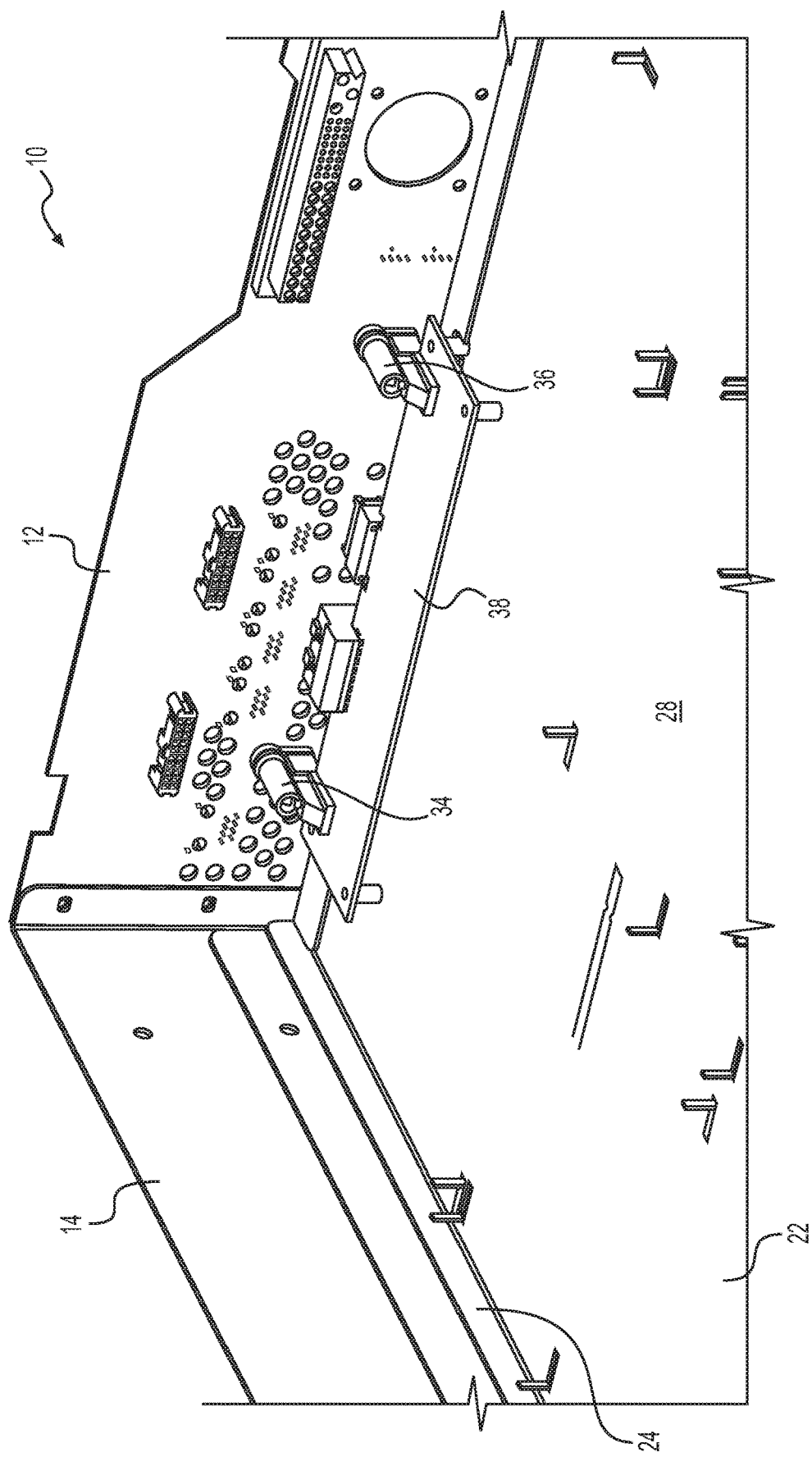
FIG. 3 is a perspective, detailed view of the rack of FIG. 1 with a fully inserted component in accordance with an embodiment of the present technology.

Referring now to the drawings, FIG. 1 is a perspective, exploded view of a rack 10 in accordance with an embodiment of the present technology. The rack 10 may for example be a 19-inch, standard-size rack having dimensions as defined in the EIA/ECA-310-E "Cabinets, Racks, Panels, And Associated Equipment" standard published by The Electronic Components Sector Of The Electronic Industries Alliance, December 2005. FIG. 2 is a perspective, detailed view of the rack 10 of FIG. 1 with a partially inserted component in accordance with an embodiment of the present technology. FIG. 3 is a perspective, detailed view of the rack 10 of FIG. 1 with a fully inserted component in accordance with an embodiment of the present technology. Referring at once to FIGS. 1, 2 and 3, the rack 10 comprises a backplane 12, a pair of side panels 14, 16 extending from the backplane 12, and support members 18, 20 mounted on each side panel 14, 16. Each support member 18, 20 is internal to the rack 10 and adapted to mate with a corresponding side edge 24, 26 of a component 22 that may be inserted in the rack 10. The component 22 is made of a main, standard-size board 28 on which a non-standard-size component (shown on later Figures) is mounted. The support members 18, 20 mechanically guide an initial alignment of the component 22 upon initial insertion of the component 22 in the rack 10. Two male connectors 30, 32 mounted to the backplane 12 are configured to mate with two female connectors 34, 36 supported by a secondary board 38 that, in turn, is mounted to the rear of the standard-size board 28 of the component 22. Mating of two male connectors 30, 32 with the two female connectors 34, 36 helps to mechanically guide a final alignment of the component 22 when the component is further inserted in the rack 10. Though not illustrated, an additional pair of male connectors may be mounted on the backplane 12 and an additional pair of female connectors may be mounted on the secondary board 38, or on another secondary board, for redundancy purposes.

As illustrated, the two male connectors 30, 32 are defined in a plane parallel to the standard-size board 28 and perpendicular to the side panels 14, 18. Configurations in which two male connectors 30, 32 would be positioned vertically, one above the other, or defining an angle not parallel to a surface of the standard-size board 28, to mate with similarly positioned female connectors 34, 36, are also contemplated. As shown on FIG. 1, the rack 10 defines a plurality of parallel stages 40, each respective stage 40 being adapted for receiving a respective component 22. Each respective stage 40 includes respective support members 18, 20 mounted to the side panels 14, 16. Each respective support member is internally positioned in the rack 10 and adapted to mate with a corresponding side edge 24, 26 of the respective component 22 to mechanically guide an initial alignment of the respective component 22 upon initial insertion of the respective component 22 in the respective stage 40. Each respective stage 40 also includes a respective set of two male connectors 30, 32 mounted in the backplane 12 and configured to mate with two female connectors 34, 36 of the respective component 22 to mechanically guide a final alignment of the respective component 22 when the respective component 22 is further inserted in the rack 10. Without limitation, a vertical spacing between each of the plurality of parallel stages 40 may correspond to a standard-size rack unit (RU or "U"), for example having a height of 1.75 inches, as defined in the EIA/ECA-310-E standard.

The backplane 12 and the side panels 14 and 16 extend vertically and the support members 18, 20 are positioned so that each component 22 can be received in the rack 10 in a horizontal position. While the positioning of the backplane 12, side panels 14, 16 and components 22 complies with the conventional positioning of the EIA/ECA-310-E standard, the present disclosure is not so limited. For example, the side panels 14 and 16 could extend horizontally (becoming upper and lower panels), in which case the components 22 would extend vertically when received in the rack 10.

Figure 4:
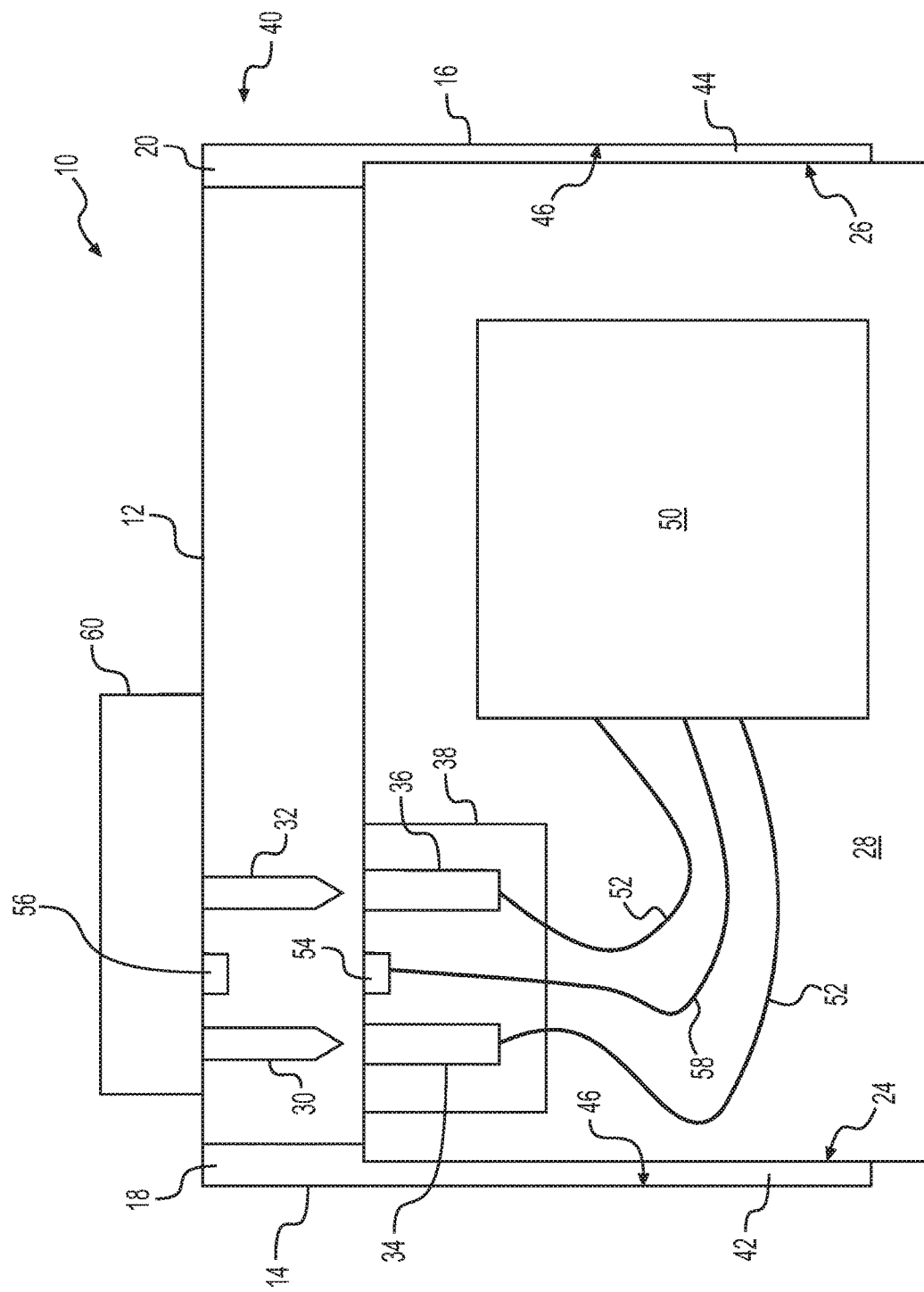
FIG. 4 is schematic top plan view of the rack of FIG. 1 with a partially inserted component in accordance with an embodiment of the present technology.
Figure 5:
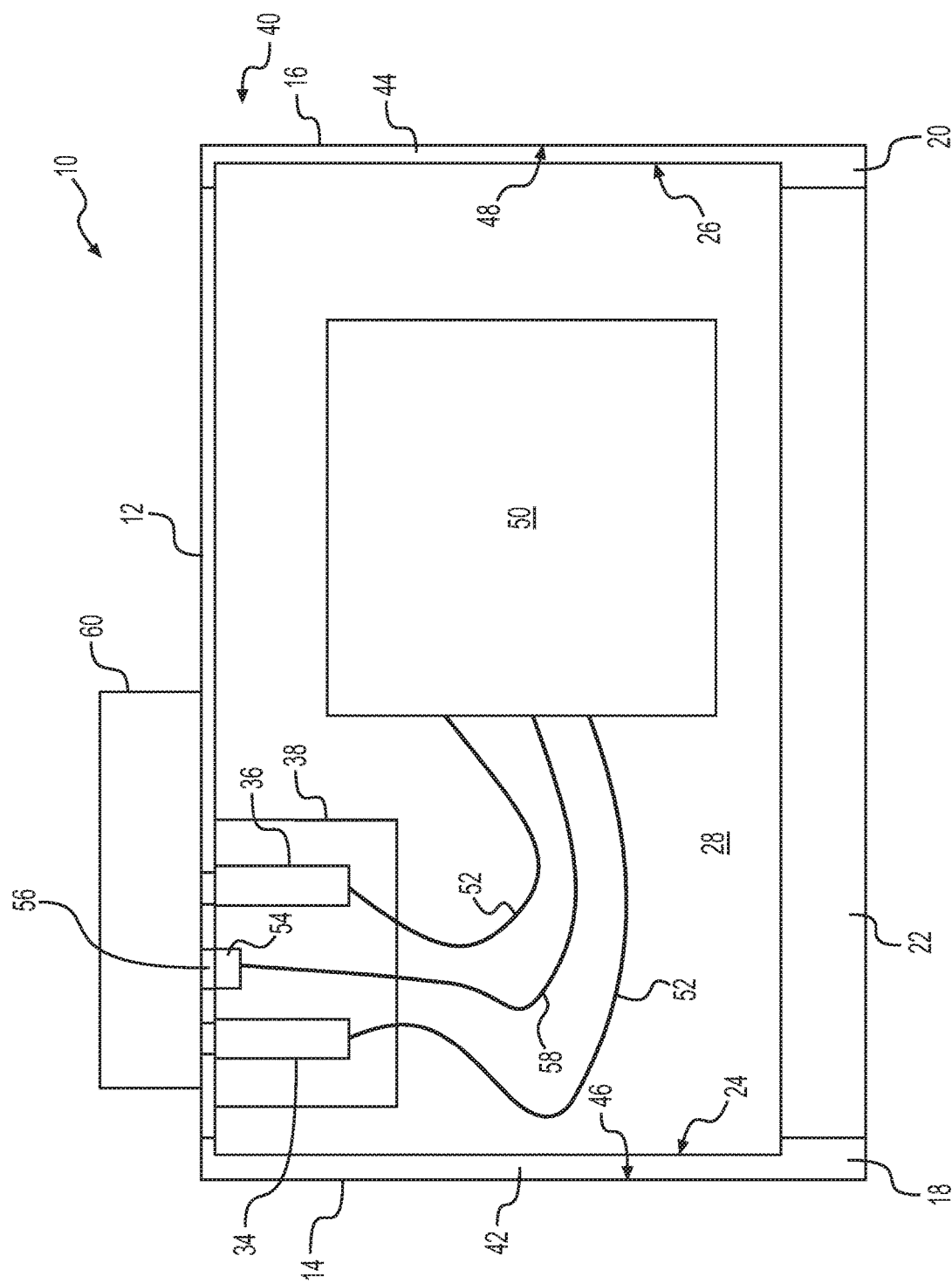
FIG. 5 is schematic top plan view of the rack of FIG. 1 with a fully inserted component in accordance with an embodiment of the present technology.

FIG. 4 is schematic top plan view of the rack 10 of FIG. 1 with the partially inserted component 22 in accordance with an embodiment of the present technology. FIG. 5 is schematic top plan view of the rack 10 of FIG. 1 with the fully inserted component 22 in accordance with an embodiment of the present technology. Referring at once to FIGS. 4 and 5, one stage 40 is illustrated; it is however understood that the rack 10 may include a plurality of parallel stages 40, as illustrated in FIG. 1, each parallel stage 40 being similarly constructed and including the same or equivalent respective elements as those shown on FIGS. 5 and 6.

FIGS. 4 and 5 are not to scale. In particular, the size of lateral gaps 42, 44 between the side edges 24, 26 of the standard-size board 28 and internal faces 46, 48 of the side panels 14, 16 are exaggerated for illustration purposes. Relative dimensions of the male connectors 30, 32 and of the female connectors 34, 36 and spacing between the two male connectors 30, 32 or between the two female connectors 34, 36, in view of general dimensions of the rack 10 and of the standard-size board 28, do not necessarily reflect an actual implementation.

FIGS. 4 and 5 reproduce several of the elements of FIGS. 1, 2 and 3 and further show a non-standard-size component 50 mounted on the standard-size board 28 of the component 22. The non-standard-size component 50 may include, without limitation, any electronic device or group of devices (not shown) that perform processing functions, data storage functions, and like functions adapted for the purposes of the rack 10. In some embodiments, the electronic device or group of devices may be mounted directly on the standard-size board 28. In an embodiment of the present technology, the component 22 is connected to a group 60 of electrical components mounted on the backplane 12. The group 60 and its electrical components are illustrated in details in a later Figure. Electrical supply to the component 22 may optionally be made via the male connectors 30, 32 and the female connectors 34, 36. A contactor 54 and a contactor 56 that are respectively mounted to the secondary board 38 and to the backplane 12 enable data communication between the component 22 and the group 60 of electrical components. In this embodiment, the non-standard-size component 50 is connected to the female connectors 34, 36 via electrical leads 52 and connected to the contactor 54 via a data connection 58. The electrical leads 52 and/or the data connection 58 may be implemented as wires or may be integrated at least in part within the board 28.

In the embodiment of FIGS. 1 to 5, the female connectors 34, 36 mounted on the component 22 (either directly or being mounted on the secondary board 38) and the male connectors 30, 32 mounted on the backplane 12 facilitate the alignment of the component 22 when inserted in the rack 10. The male connectors 30, 32 and the female connectors 34, 36 may or may not support additional functions or features.

In a variant of the present technology, additional connections between the component 22 and the backplane 12 are provided by fluidic ports for exchange of liquid (e.g. water) for cooling the rack 10 and, in particular but without limitation, for cooling equipment mounted behind the backplane 12. These ports include inlet and outlet ports mounted in the backplane 12, as well as feed and return ports that are part of a liquid connector mounted on the component 22.

In a first embodiment, the inlet and outlet ports may double as male connectors 30, 32 and the feed and return ports may double as female connectors 34 and 36, in which case no other component may be used to facilitate the alignment of the component 22 in the backplane 12. In a second embodiment, the inlet and outlet ports may be used as substitutes for one of the male connectors 30, 32 and the feed and return ports may be used as substitutes for one of the female connectors 34, 36. In that second embodiment, the liquid connector (including the feed and return ports) is mounted on the component 22 at a distance from another female connector also mounted on the component 22 while the inlet and outlet ports are mounted on the backplane 12 at a distance from another male connector also mounted on the backplane 12. In these first and second embodiments, other electrical connections are provided between the component 22 and the backplane, as will be described hereinbelow. In a third embodiment, male and female connectors as illustrated in FIGS. 1 to 5 are present in addition to the liquid connector.

Figure 6:
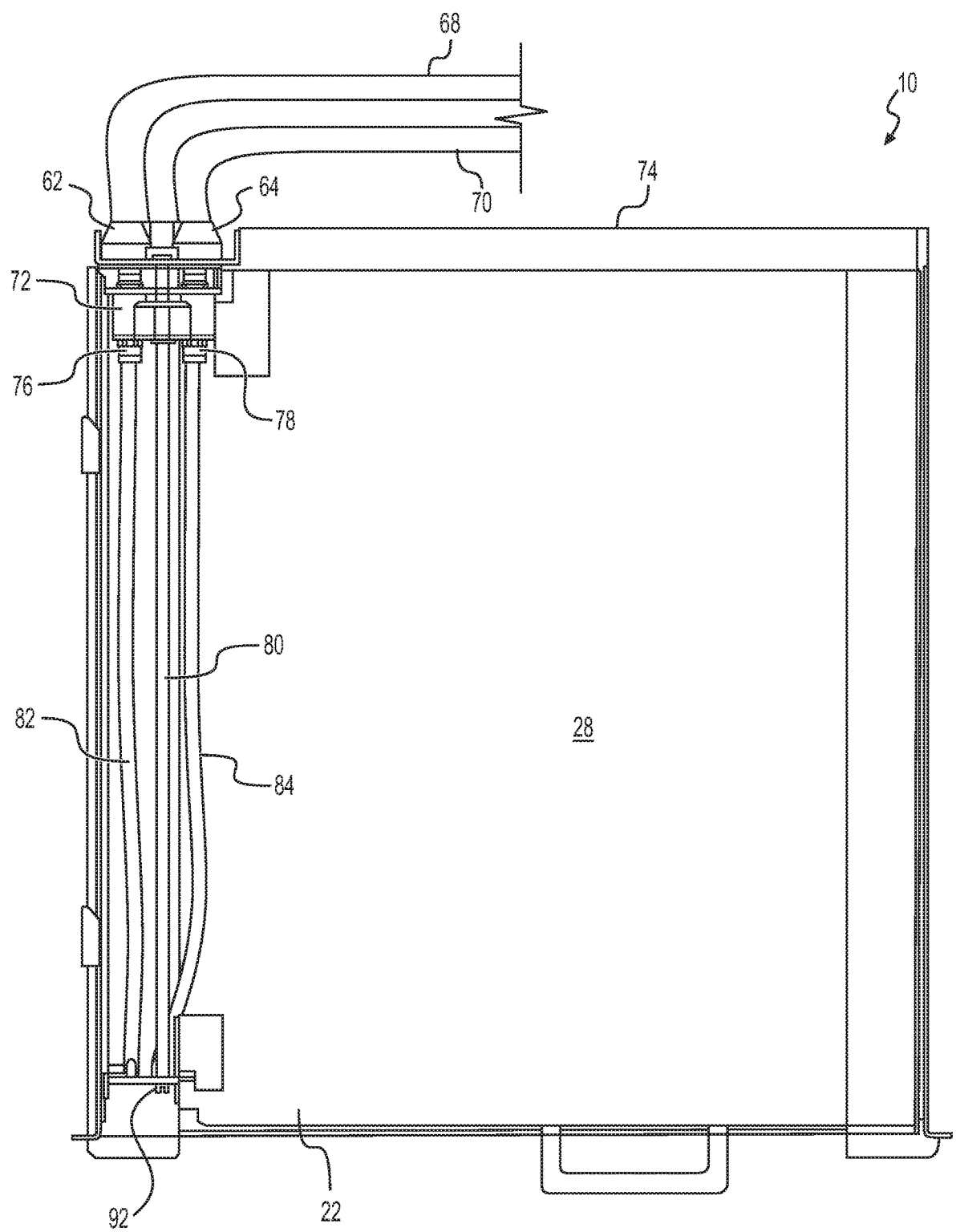
FIG. 6 is a top plan view of a variant of a component insertable in the rack of FIG. 1, the component providing a fluidic connection for cooling purposes.

FIG. 6 is a top plan view of a variant of a component 22 insertable in the rack 10 of FIG. 1, the component 22 providing a fluidic connection for cooling purposes. FIG. 6 illustrates the above-mentioned, non-limiting first embodiment in which the inlet and outlet ports double as male connectors 30, 32 while the feed and return ports double as female connectors 34 and 36. In this variant, a male inlet port 62 and a male outlet port 64 are mounted on a section 66 of the backplane 12. The inlet port 62 is connected to a "cold" inlet tube 68 mounted behind the backplane 12 for distributing liquid, for example water, for cooling of equipment mounted in the rack 10. The liquid returns to the outlet port 64 via a "hot" outlet tube 70. A liquid adaptor 72 is mounted on the component 22, proximally to a rear edge 74 of the component 22. The liquid adaptor 72 comprises a female feed port 76, a female return port 78, and an elongate rod 80 that extends at one end between the feed and return ports 76, 78 and at another end to a front of the component 22. The feed port 76 and the return port 78 are respectively adapted for mating with the inlet port 62 and with the outlet port 64 when the component 22 is inserted in the rack 10. Operation of the elongate rod 80 is described hereinbelow. A "cold" feed tube 82 is connected to the feed port 72 and extends to the front of the component 22. A "hot" return tube 84 is connected to the return port 74 and also extends to the front end of the component 22. When the component 22 is fully installed, a cooling liquid may be injected via the feed tube 82 and reach the inlet tube 68, the liquid returning to the return tube 84 via the outlet tube 70.

Figure 7:
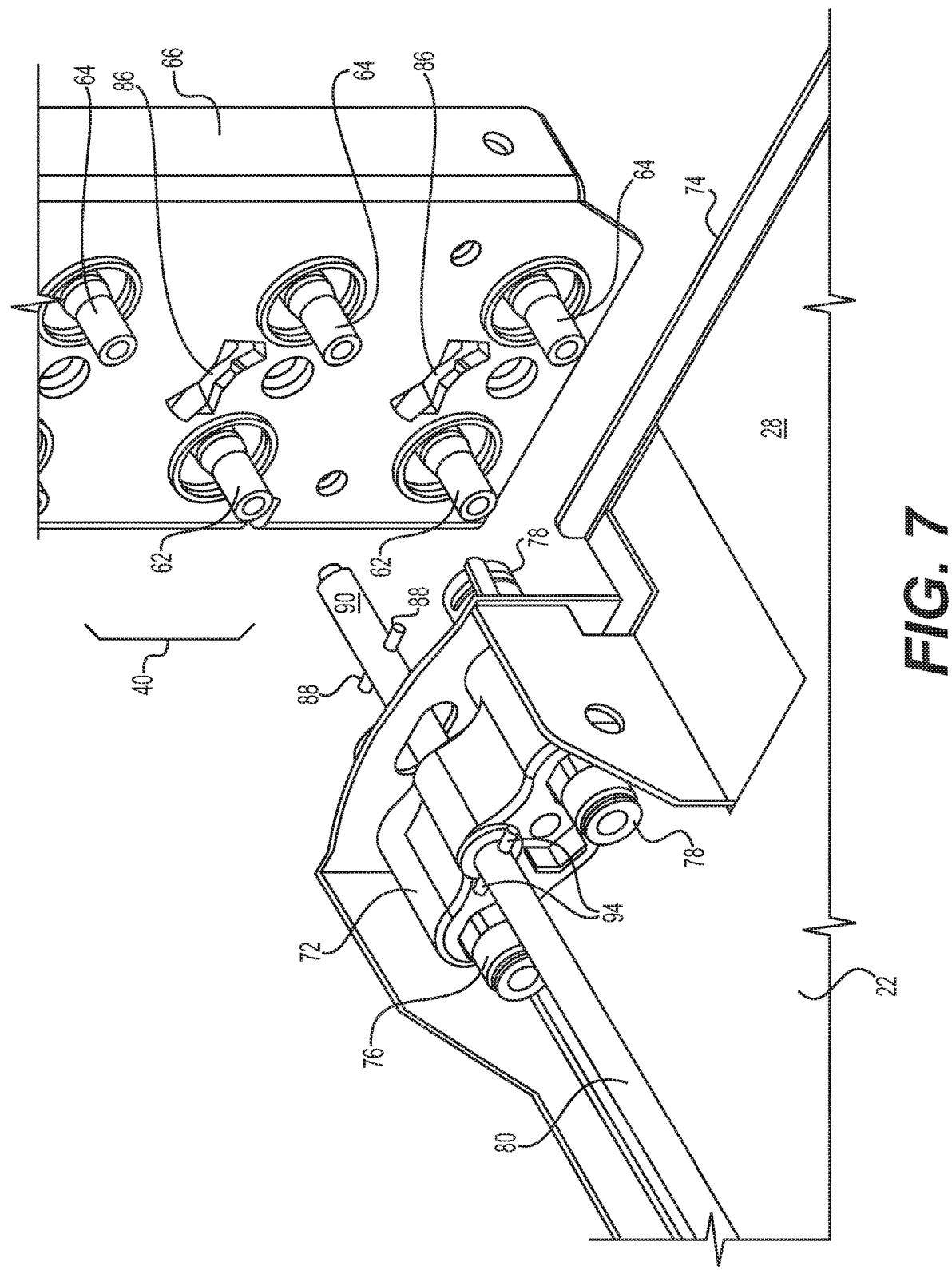
FIG. 7 is a perspective, detailed view of the component of FIG. 6 partially inserted in a rack in accordance with an embodiment of the present technology.
Figure 8:
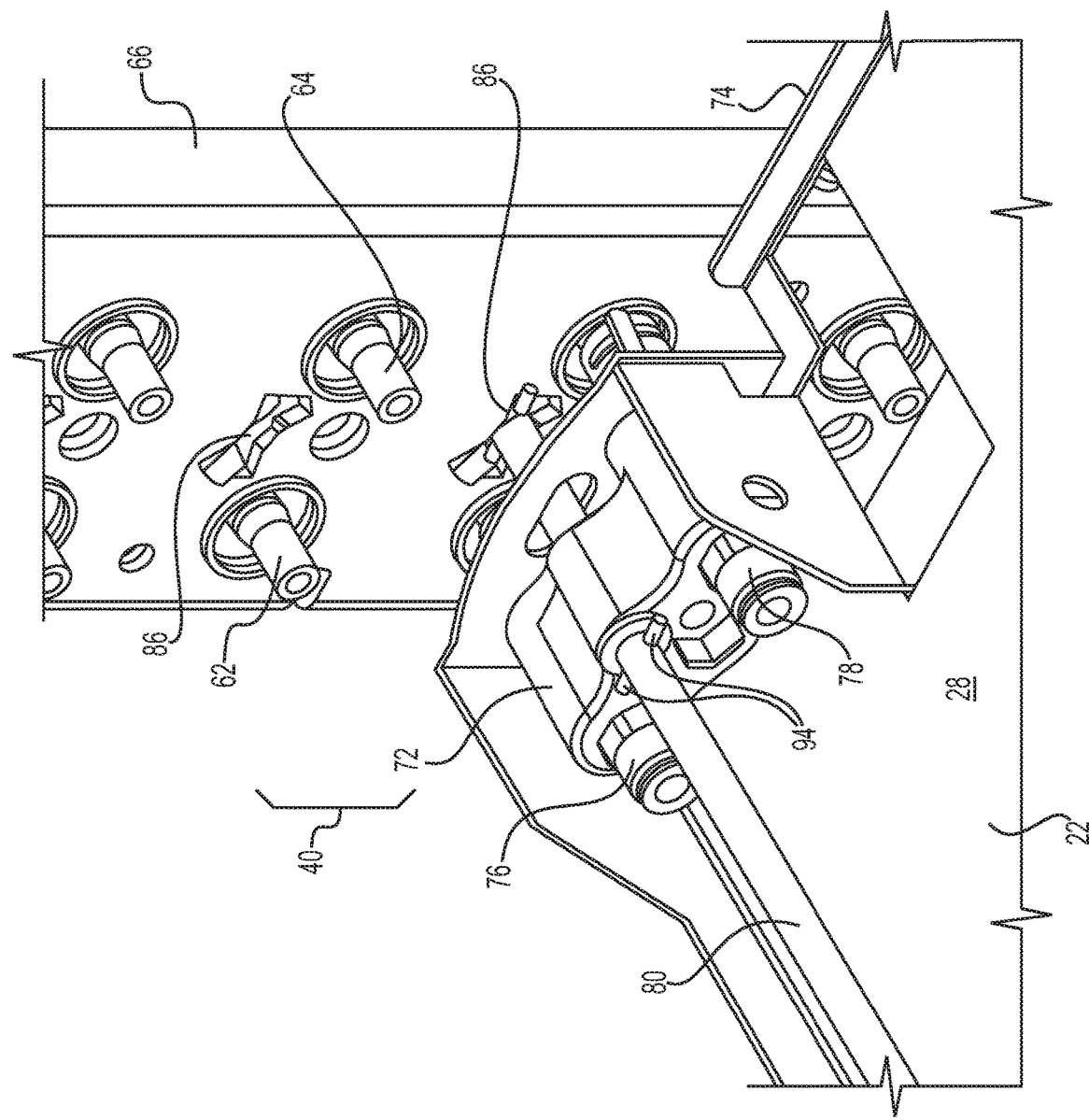
FIG. 8 is a perspective, detailed view of the component of FIG. 6 being substantially fully inserted in the rack in accordance with an embodiment of the present technology.
Figure 9:
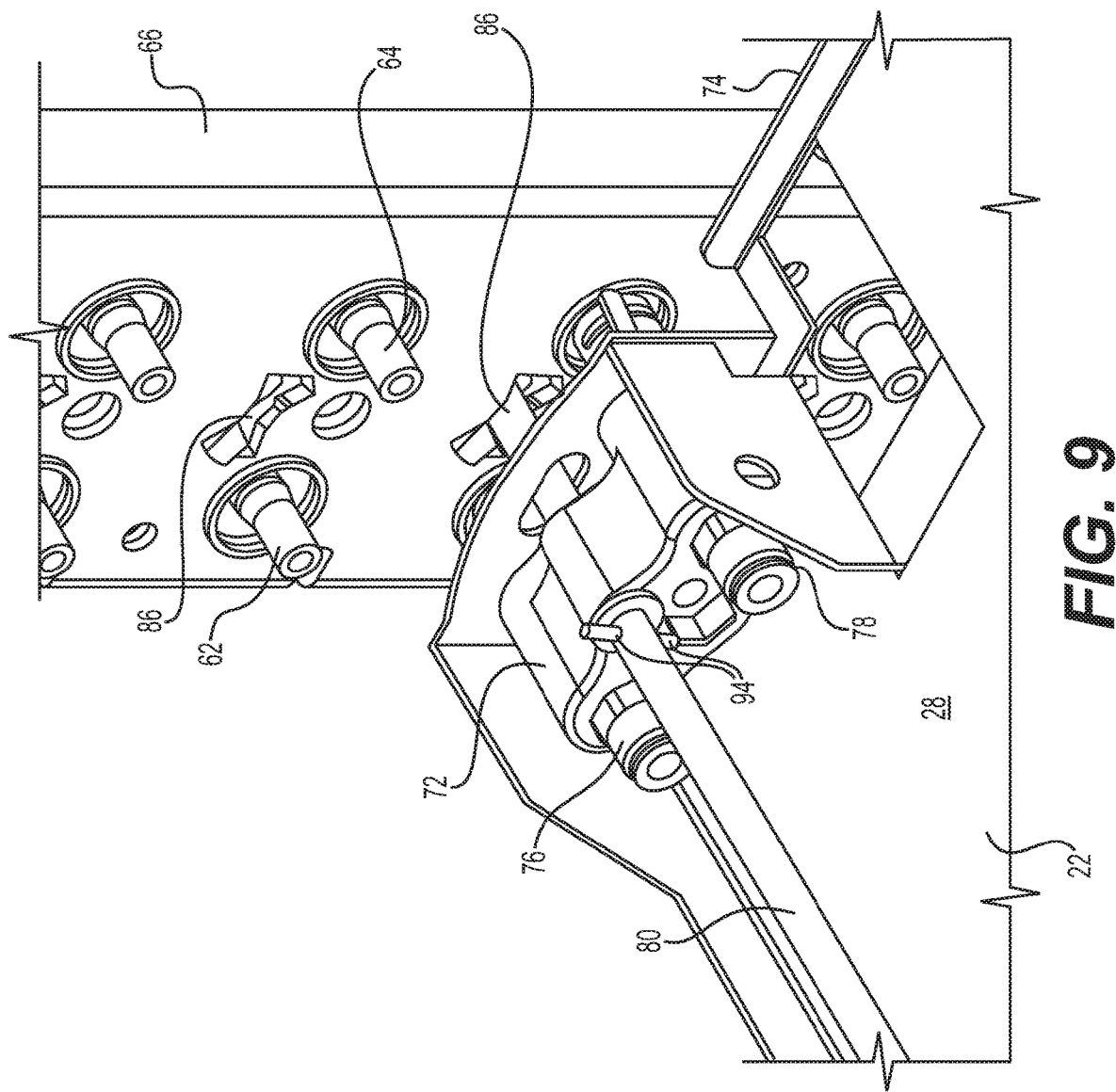
FIG. 9 is a perspective, detailed view of the component of FIG. 6 being fully inserted and locked in the rack in accordance with an embodiment of the present technology.

FIG. 7 is a perspective, detailed view of the component 22 of FIG. 6 partially inserted in the rack 10 in accordance with an embodiment of the present technology. FIG. 8 is a perspective, detailed view of the component 22 of FIG. 6 being substantially fully inserted in the rack 10 in accordance with an embodiment of the present technology. FIG. 9 is a perspective, detailed view of the component 22 of FIG. 6 being fully inserted and locked in the rack 10 in accordance with an embodiment of the present technology. The various tubes of FIG. 6 omitted on FIGS. 6 to 9 in order to simplify the illustration. Referring at once to FIGS. 6 to 9, an inlet port 62 and an outlet port 64 are mounted in each stage 40 on the section 66 of the backplane 12. A slot 86 is formed in each stage 40 of the backplane 12. Each slot 86 is proximal to a corresponding inlet port 62 and to a corresponding outlet port 64. The slot 86 located on a given stage 40 forms an attachment point for the liquid adaptor 72 located on a component 22 that is on the same stage 40 of the rack 10. As illustrated, a center of the inlet port 62, a center of the outlet port 64 and a center of the slot 86 on the same stage 40 generally form a flat triangle. The slot 86 may alternatively be positioned between the corresponding inlet and outlet ports 62, 64. The elongate rod 80 has lateral extensions 88, such as pins, on an end section 90 of the elongate rod 80 that protrudes beyond the rear edge 74 of the component 22, the feed port 76 and the return port 78.

It may be noted that the pair formed by the inlet port 62 and the feed port 76 is interchangeable with the pair formed by the outlet port 64 and the return port 78. In fact, the hot and cold tubes may be connected to any one of the ports as long as consistency is maintained between these connections and a cooling system (not shown) of the rack 10.

A front end 92 of the elongate rod 80 opposite from the end section 90 is configured for receiving a rotating motion from a connectable handle, a screwdriver, or like tool (not shown). The elongate rod 80 is rotated, for example manually, for aligning the lateral extensions 88 with the slot 86 prior to full insertion of the component 22 in the rack 10, substantially as illustrated on FIG. 7. FIG. 8 shows that the end section 90 and the lateral extensions 88 have been inserted via the slot 86 within the backplane 12. The elongate rod 80 has not yet been rotated further from its position on FIG. 7, as evidenced by the orientation of pins 94 that remains unchanged between FIGS. 7 and 8. FIG. 9 shows that the elongate rod 80 is rotated about a quarter of a turn, as evidenced by the different orientation of the pins 94. The rotation of the elongate rod 80 places the lateral extensions 88 out of alignment with the slot 86 after full insertion of the component 22 in the rack 10. This causes the lateral extensions 88 to abut on a face (not shown) of the backplane 12 opposite from the component 22 to maintain the liquid adaptor 72 in place. There may be a slight movement of the component 22 in relation to the backplane 12 between FIGS. 8 and 9, the liquid connector 72 and the rear edge 74 of the component 22 being brought slightly closer to the backplane 12 on FIG. 9. This movement is caused by a pressure applied on the liquid connector 72 by the pins 94 when the lateral extensions 88 are slightly pulled inward of the backplane 12 by the rotation of the elongate rod 80, the lateral extensions 88 being forcefully entrained on the face of the backplane 12 opposite from the component 22. This movement has at least a double effect, in which the component 22 is held firmly in place in the rack 10 while, in addition, watertight connections are established between the inlet and feed ports 62, 76 and between the outlet and return ports 64, 78. It may be noted that seals (not shown) such as for example Teflon™ or rubber rings may be provided to prevent leakage at the connections between the various ports.

In some applications, the connections of the female feed and return ports 76, 78 of the liquid connector 72 to the male inlet and outlet ports 62, 64 mounted on the section 66 of the backplane 12 may suffice to provide proper alignment of the component 22 in the rack 10. Alternatively, an embodiment of the rack 10 may include at once the male connectors 30, 32 and the female connectors 34, 36 as illustrated on FIG. 1-5, along with the liquid connector 72 as illustrated on FIG.

6. Another embodiment may include a single male connector 30 mounted on the backplane 12 and a single female connector 34 cooperating with the liquid connector 72 and the inlet and outlet ports 62, 64 to provide proper alignment of thee component 22 in the rack 10.

Figure 10:
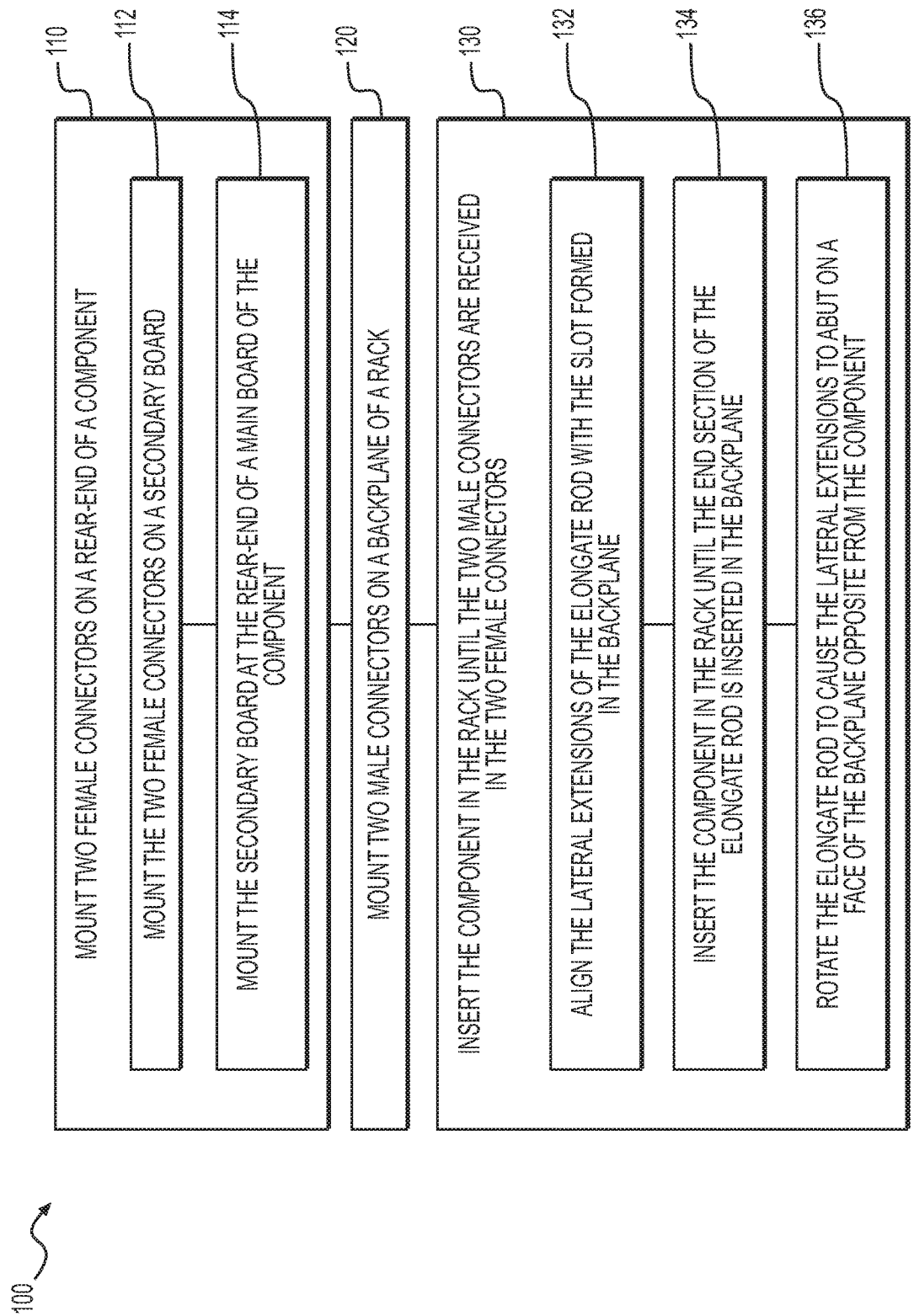
FIG. 10 is a sequence diagram of a method of mounting a component in a rack in accordance with an embodiment of the present technology.

FIG. 10 is a sequence diagram of a method of mounting the non-standard-size component 50 in the rack 10 in accordance with an embodiment of the present technology. On FIG. 10, a sequence 100 comprises a plurality of operations that may be executed in variable order, some of the operations possibly being executed concurrently, some of the operations being optional. In the sequence 100, operation 110 comprises mounting the two female connectors 34, 36 on a rear end of the component 22. In this operation 110, the two female connectors 34, 36 may be mounted directly on the component 22. Alternatively, operation 110 may comprise sub-operation 112 that includes mounting the two female connectors 34, 36 on a secondary board 38, and sub-operation 114 that includes mounting the secondary board 38 at the rear end of the main board 28 of the component 22. At operation 120, the two male connectors 30, 32 are mounted on the backplane 12 of the rack 10.

At operation 130, the component 22 is inserted in the rack 10 until the two male connectors 30, 32 are received in the two female connectors 34, 36. If at least one of the two male connectors 30, 32 comprises the inlet and outlet ports 62, 64, in which case a corresponding at least one of the two female connectors 34, 36 comprises the feed and return ports 76, 78, operation 130 may comprise sub-operations 132, 134 and 136. At sub-operation 132, the lateral extensions 88 of the elongate rod 80 are substantially aligned with the slot 86 formed on the backplane 12. At sub-operation 134, the component 22 is inserted in the rack 10 until the end section 90 of the elongate rod 80 is inserted in the backplane 12. At sub-operation 136, after full insertion of the component 22 in the rack 10, the elongate rod 80 is rotated for placing the lateral extensions 88 out of alignment with the slot 86 to cause the lateral extensions to abut on the face of the backplane 12 opposite from the component 22 to maintain the component 22 inserted in the rack 10.

Figure 11:
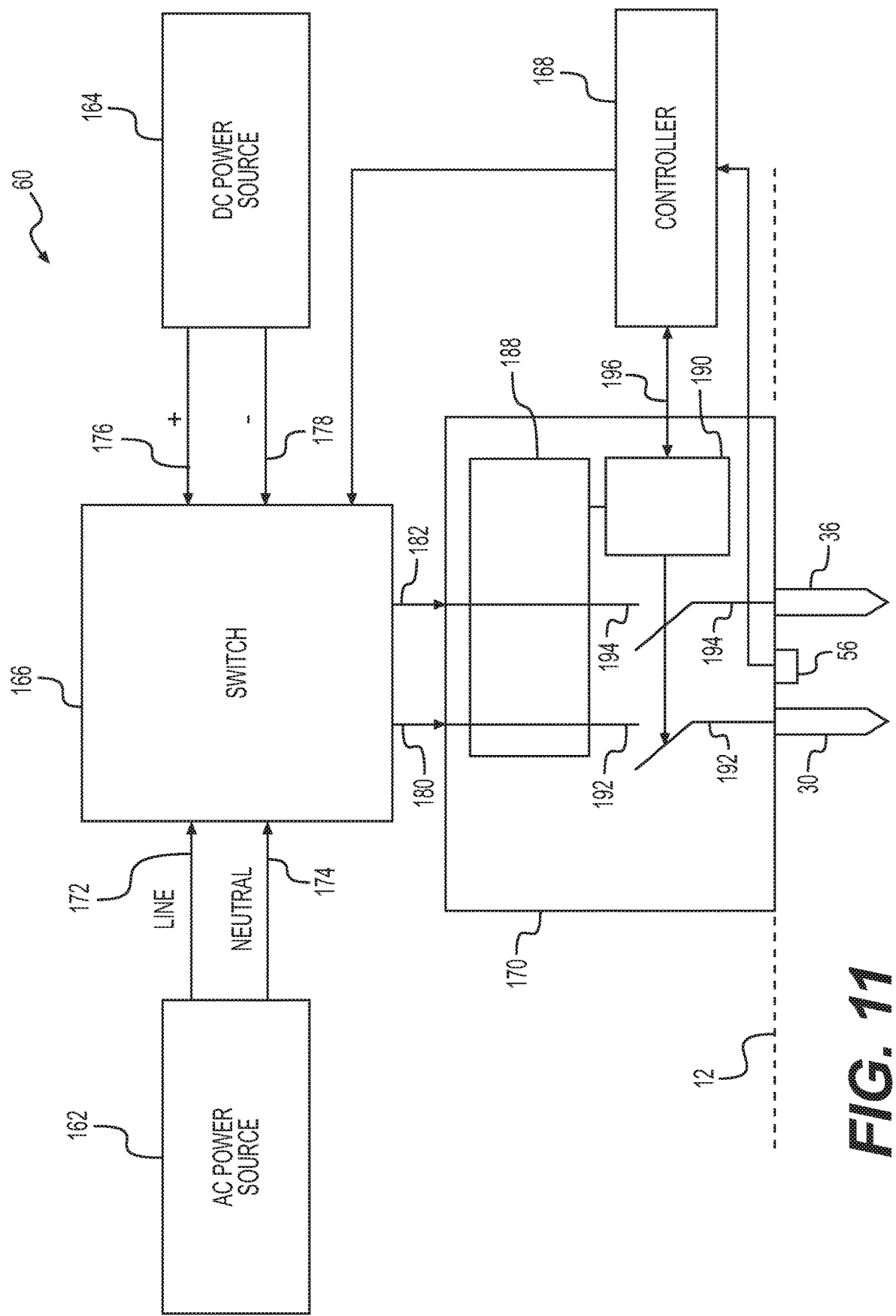
FIG. 11 is a block diagram showing backplane electrical components of the rack of FIG. 1 in accordance with an embodiment of the present technology.

The group 60 of electrical components introduced in the foregoing description of FIGS. 4 and 5 is illustrated in details on FIG. 11, which is a block diagram showing backplane electrical components 60 of the rack 10 of FIG. 1 in accordance with an embodiment of the present technology. The group 60 comprises an AC power source 162, DC power source 164, a switch 166, a controller 168 and a protection circuit 170. The AC power source 162 is connected to the switch 166 via a line connection 172 and a neutral connection 174. The DC power source 164 is connected to the switch 166 via a positive connection 176 and a negative connection 178. The switch 166 has two (2) outputs 180 and 182 that are respectively connected via the protection circuit 170 to the male connectors 30, 32.

The protection circuit 170 includes a sensor 188 of a level of power delivered from the backplane 12 to the component 22 and a breaker 190 operatively connected to the sensor and selectively connecting the switch 166 to the two male connectors 30, 32. The sensor 188 may comprise a power meter to directly measure the level of power delivered to the component 22 or an ammeter to measure a current delivered to the component 22. The breaker 190 disconnects leads 192, 194 that extend between the outputs 180, 182 of the switch 166 and the male connectors 30, 32 to interrupt the delivery of power to the component 22 when the sensor 188 senses that the power level exceeds a high power threshold or, equivalently, when the sensor 188 senses that the current delivered to the component 22 exceeds a high current threshold. The breaker 190 may resume the delivery of power to the component 22 in response to receiving, after interruption of the delivery of power to the component 22, a rearm command 196 from the controller 168.

In an embodiment, when the component 22 is partially inserted in the rack 10, an initial contact is established between at least one of the two male connectors 30, 32 and at least one of two female connectors 34, 36. Electrical conductivity between the male and female connectors may be detected and reported to the controller 168. The controller 168 may detect an electrical continuity between the male connectors 30, 32, the female connectors 34, 36 and any part of the component 22. The at least one of the two male connectors 30, 32 and the at least one of two female connectors 34, 36 may thus form a detector of the initial contact. When the component 22 is fully inserted in the rack 10, the contactors 54 and 56 come in contact with one another to allow data communication between the non-standard-size component 50 and electrical components in the backplane 12. As the contactors 54 and 56 come in contact, they may form a detector of a full insertion of the two male connectors 30, 32 in the two female connectors 34, 36. The full insertion detected by the contactors 54 and 56 is reported to the controller 168. In response to the detection of the full insertion, the controller causes the switch 166 to allow either the AC power source 162 or the DC power source 164 to start delivering power to the component 22 inserted in the rack 10 via electrical connections established between the two male connectors 30, 32 and the two female connectors 34, 36 of the component inserted 22 in the rack 10.

AC or DC power delivery is selected in response to information provided upon detection of the initial contact between the male connectors 30 and 32, and the female connectors 34, 36, or by the contactors 54 and 56, when they detect further insertion of the component 22 in the rack 10. A type of the non-standard-size component 50 is detected. In a first variant, the controller 168 may read this type via the male connectors 30, 32, the female connectors 34, 36 and the leads 52 connecting the female connectors 34, 36 to the non-standard-size component 50. In a second variant, the controller 168 may read this type via the contactors 54, 56 and the data connection 58 between the contactor 54 and the non-standard-size component 50. The type may be stored in an electrically-erasable programmable read-only memory (EEPROM) (not shown) mounted on the non-standard-size component 50. In either variant, these connections allow the controller 168 to determine, based on the detected type, whether the non-standard-size component 50 requires AC or DC power. Also in either variant, these connections allow the controller 168 to read a required polarity of the non-standard-size component 50 when the non-standard-size component 50 requires DC power or identifications of a line input and of a neutral input of the non-standard-size component 50 when the non-standard-size component 50 requires AC power.

When the non-standard-size component 50 requires DC power, the controller 168 causes the switch 166 to connect one of the two male connectors 30, 32 to the positive connection 176 of the DC power source 164 and to connect the other of the two male connectors 30, 32 to the negative connection 178 of the DC power source 64. Which one of the two male connectors 30, 32 is connected to the positive connection 176 or to the negative connection 178 of the DC power source 164 is selected in view of the required polarity of the non-standard-size component 50. When the nonstandard-size component 50 requires AC power, the controller 168 causes the switch 166 to connect one of the two male connectors 30, 32 to the line connection 172 of the AC power source 162 and to connect the other of the two male connectors 30, 32 to the neutral connection 174 of the AC power source 162. Which one of the two male connectors 30, 32 is connected to the line connection 172 or to the neutral connection 174 of the AC power source 162 is selected in view of the line and neutral inputs of the non-standard-size component 50.

Figure 12:
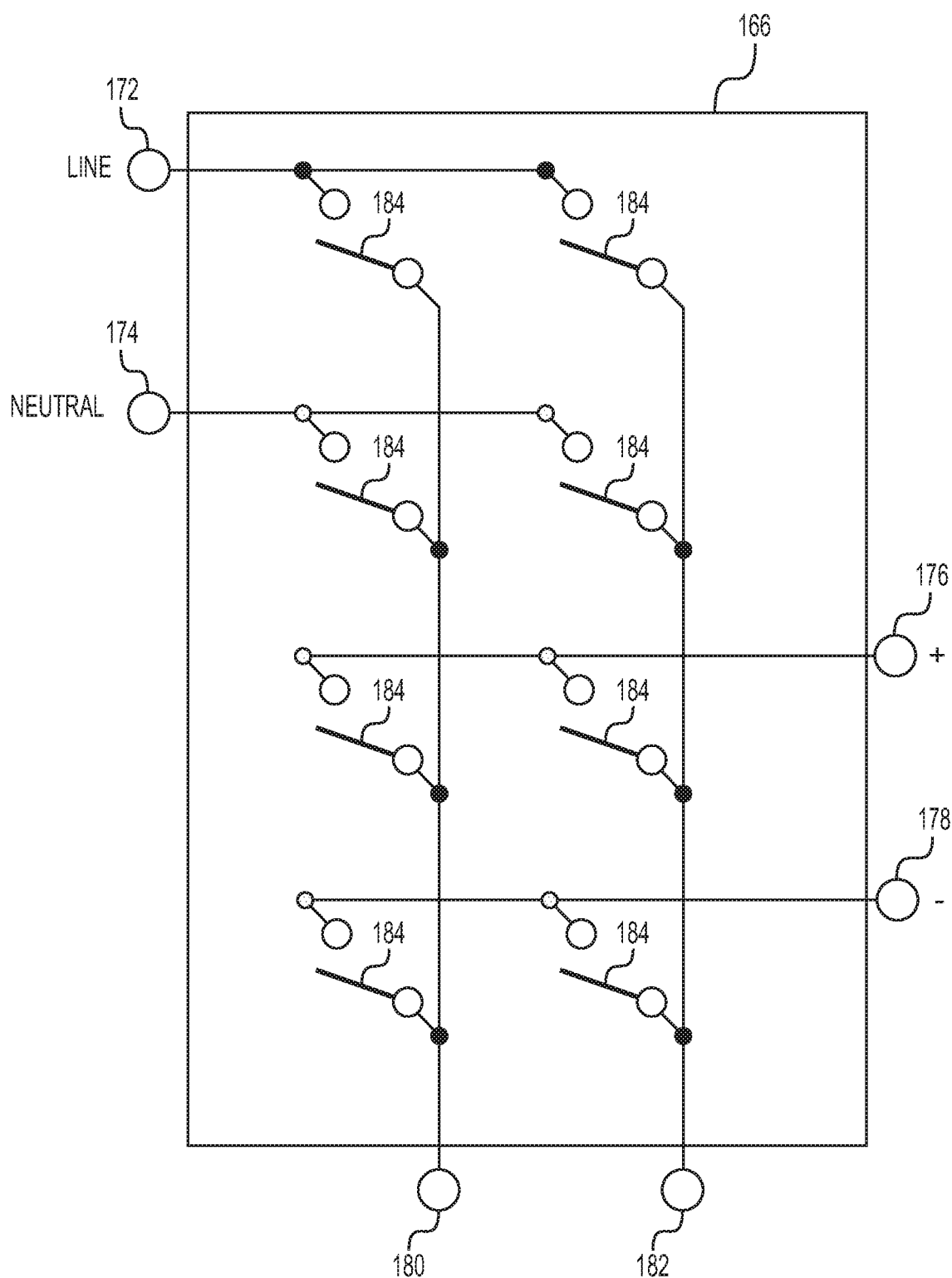
FIG. 12 is a schematic diagram of internal connections of the switch of FIG. 11 in accordance with an embodiment of the present technology.

FIG. 12 is a schematic diagram of internal connections of the switch 166 of FIG. 11 in accordance with an embodiment of the present technology. The switch 166 is controlled by the controller 168 and includes internal commutators 184 that can connect any one of the line connection 172, the neutral connection 174, the positive connection 176 and the negative connection 178 to any one of the outputs 180, 182. The controller 168 or an internal logic of the switch 166 ensures that no unsafe combination of the internal commutators 184 is made within the switch 166.

Figure 13:
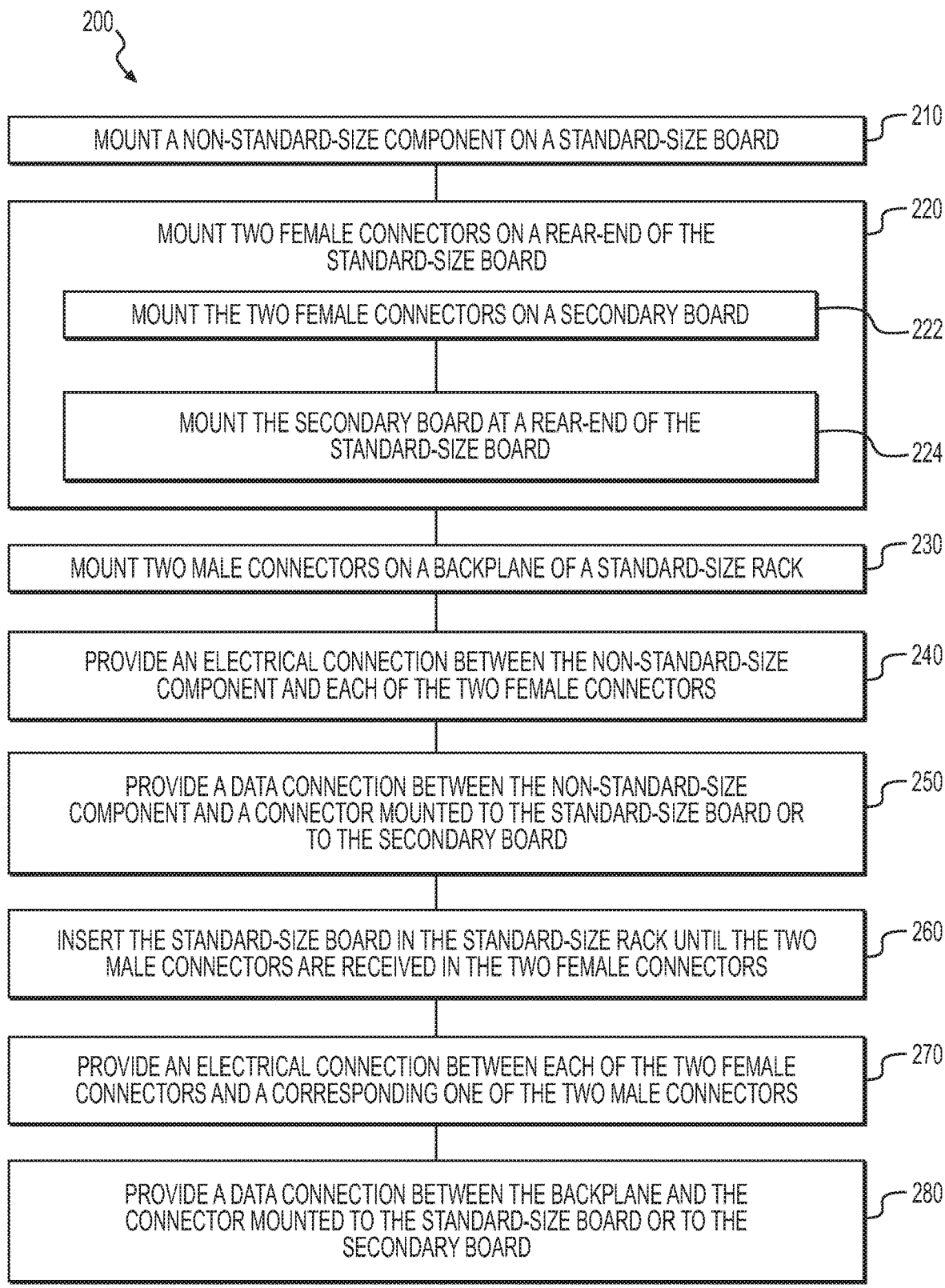
FIG. 13 is a sequence diagram of a method of mounting a non-standard-size component in a in accordance with an embodiment of the present technology.

FIG. 13 is a sequence diagram of a method of mounting a non-standard-size component 50 in the rack 10 in accordance with an embodiment of the present technology. On FIG. 13, a sequence 200 comprises a plurality of operations that may be executed in variable order, some of the operations possibly being executed concurrently, some of the operations being optional. In the sequence 200, operation 210 comprises mounting the non-standard-size component 50 on the standard-size board 28. The two female connectors 34, 36 are mounted on a rear end of the standard-size board 28 at operation 220. In this operation 220, the two female connectors 34, 36 may be mounted directly on the standard-size board 28. Alternatively, operation 220 may comprise sub-operation 222 comprising mounting the two female connectors 34, 36 on the secondary board 38 and sub-operation 224 comprising mounting the secondary board 38 at the rear end of the standard-size board 28. At operation 230, the two male connectors 30, 32 are mounted on the backplane 12 of the rack 10. Electrical connections 52 may be provided at operation 240 between the non-standard-size component 50 and each of the two female connectors 34, 36. Likewise, the data connection 58 may be provided between the non-standard-size component 50 and the connector 54 mounted to the standard-size board 28 or to the secondary board 38 at operation 250.

At operation 260, the standard-size board 28 is inserted in the rack 10 until the two male connectors 30, 32 are received in the two female connectors 34, 36. An electrical connection may then be provided between each of the two female connectors 34, 36 and a corresponding one of the two male connectors 30, 32 at operation 270. Likewise, a data connection may be provided between the backplane 12 and the connector 54 mounted to the standard-size board 28 or to the secondary board 38 at operation 280.

Figure 14:
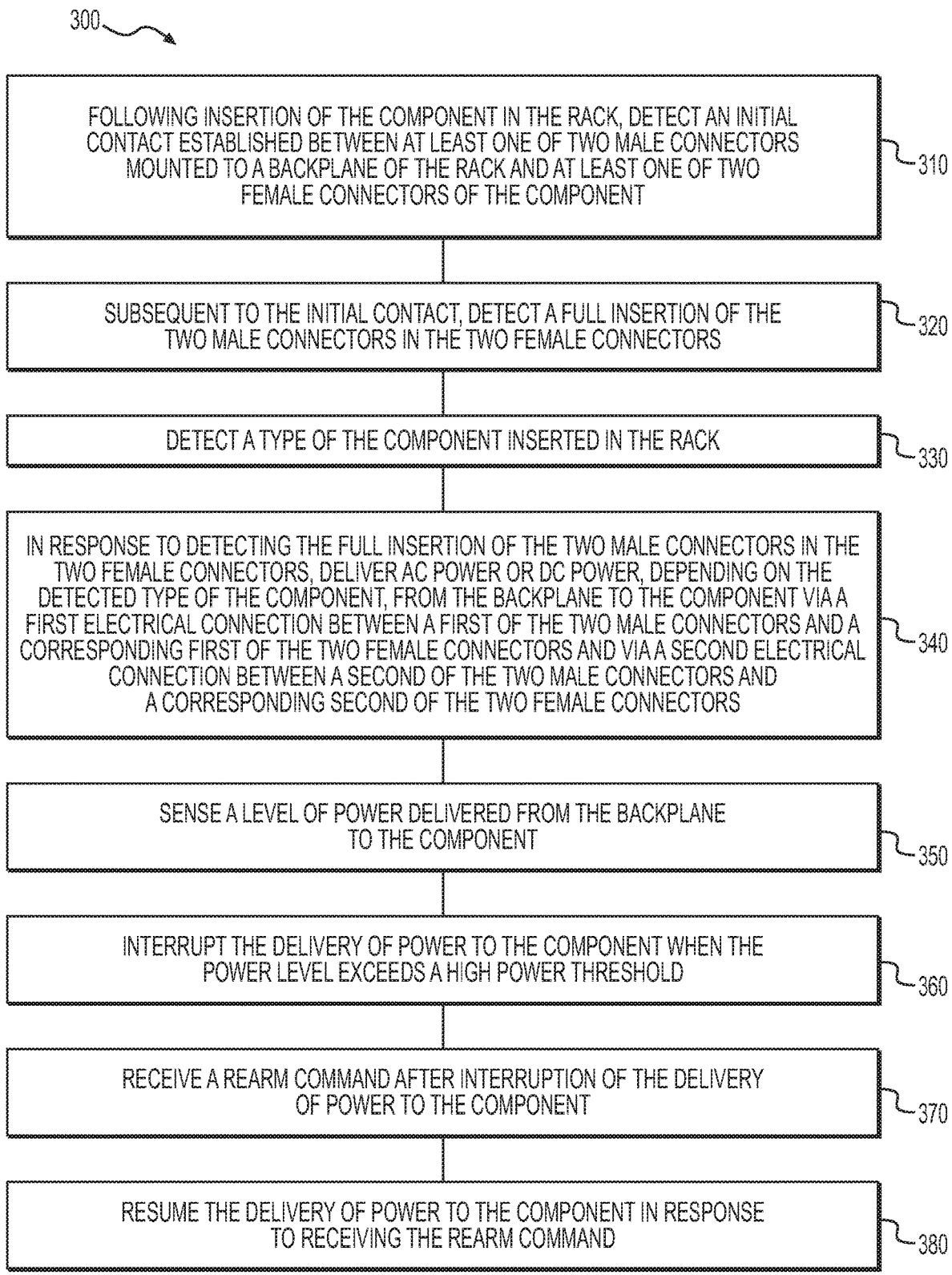
FIG. 14 is a sequence diagram of a method of delivering power to a component mounted in a rack in accordance with an embodiment of the present technology.

FIG. 14 is a sequence diagram of a method of delivering power to a component mounted in a rack in accordance with an embodiment of the present technology. On FIG. 14, a sequence 300 comprises a plurality of operations that may be executed in variable order, some of the operations possibly being executed concurrently, some of the operations being optional. In the sequence 300, operation 310 comprises detecting an initial contact established between at least one of the male connectors 30, 32 mounted to the backplane 12 of the rack 10 and at least one of the female connectors 34, 36 of the component 22. This operation 310 takes place following initial insertion of the component 22 in the rack 10. The at least one of the two male connectors 30, 32 and the at least one of the two female connectors 34, 36 are used in detecting the initial contact at operation 310, for example by reporting to the controller 168 a detected electrical continuity between the backplane 12 and the component 22. The two male connectors 30, 32 and the two female connectors 34, 36 are sized and configured to mechanically guide an alignment of the component 22 in the rack 10 following the initial contact. Subsequent to the initial contact, a full insertion of the two male connectors 30, 32 in the two female connectors 34, 36 is detected at operation 320. Detection of the full insertion may be effected when the contactors 54 and 56 are joined and reported to the controller 168.

A type of the component 22 inserted in the rack 10, more specifically a type of the non-standard-size component 50, may be detected at operation 330. This operation 330 may be omitted, for example, in an embodiment where all components 22 in the rack 10 are of the same type, all of them requiring AC power or DC power.

Responsive to detecting the full insertion of the two male connectors 30, 32 in the two female connectors 34, 36, AC or DC power is delivered at operation 340 from the backplane 12 to the component 22. Power delivery is made via a first electrical connection between a first of the two male connectors 30, 32 and a corresponding first of the two female connectors 34, 36 and via a second electrical connection between a second of the two male connectors 30, 32 and a corresponding second of the two female connectors 34, 36. Power delivery from the backplane 12 to the component 22 is in the form of AC power or DC power depending on the detected type of the component 22. Hence, the first electrical connection is a positive DC voltage connection and the second electrical connection is a DC negative voltage connection when DC power is delivered. Alternatively, the first electrical connection is a line AC voltage connection and the second electrical connection is a neutral connection when AC power is delivered.

The sequence 300 may continue with operation 350 in which a level of power delivered from the backplane 12 to the component 22 is sensed by the sensor 188 of the protection circuit 170. The level of power delivered to the component 22 may be sensed directly or calculated based on a sensed current level. The delivery of power to the component 22 may be interrupted by the breaker 190 of the protection circuit 170 at operation 360 when the sensed power level exceeds a high power threshold. A rearm command 196 may be provided by the controller 168 and received by breaker 190 of the protection circuit 170 at operation 370, after interruption of the delivery of power to the component 22. The delivery of power to the component 22 may resume at operation 380 in response to receiving the rearm command 196 at the protection circuit 170.

Other embodiments of the present technology provide various combinations of one or more of mechanical connections, fluidic connections, power connections and electronic connections of components in a same rack. An example of such embodiments is introduced on FIG. 15, which is a front perspective view of a system 400 comprising another rack 402 and at least one insertable component 404 in accordance with an embodiment of the present technology. The system 400 will be described considering also FIG. 16, which is a front perspective view taken from another angle of the rack 402 of FIG. 15 in accordance with an embodiment of the present technology, FIG. 17, which is a front elevation view of the rack 402 of FIG. 15 in accordance with an embodiment of the present technology, and FIG. 18, which is a rear perspective view taken from another angle of the rack 402 of FIG. 15 in accordance with an embodiment of the present technology. The system 400, the rack 402 and the component 404 integrate several of the elements described in relation to the previous Figures and further incorporate additional elements. For instance, the component 404 includes the liquid adaptor 72 introduced in the description of FIG. 6. The rack 402 includes on its backplane 12 the section 66 adapted for mating with the liquid adaptor 72, as introduced in the description of FIG. 6. The component 404 also includes a midplane 406 that connects to the backplane 12 of the rack 402, as will be described in details hereinbelow. The midplane 406 is mounted on a main board 408 of the component 404; the midplane 406 may be viewed as another embodiment of the secondary board 38 of earlier Figures.

Figure 15:
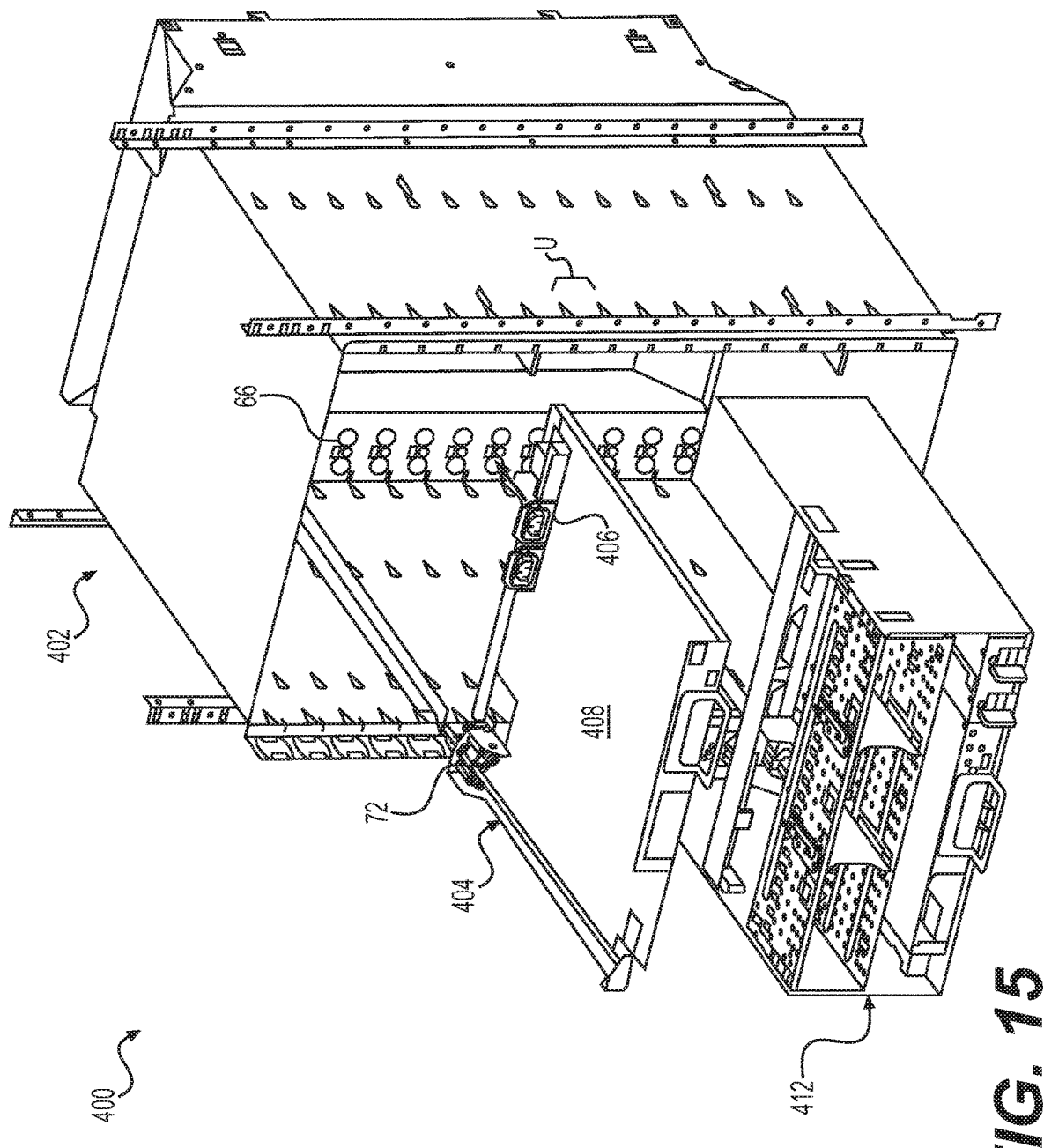
FIG. 15 is a front perspective view of a system comprising another rack and at least one insertable component in accordance with an embodiment of the present technology.

As shown on FIG. 15, the rack 402 comprises a plurality of vertically distributed rack stages that each correspond to a backplane stage 410. Each rack stage and corresponding backplane stage 410 is adapted to receive a distinct component such as the component 404. The main board 408 may be a standard-size board, for example a 19-inch board. Each rack/backplane stage 410, or position, may occupy a standard-size rack unit "U". A height of the shown component 404 is adapted to fit in a single rack stage, having a height not exceeding the unit U. Each rack stage and the corresponding backplane stage 410 are adapted to receive a distinct component when each of those components has a height that does not exceed the unit U. Another component 412 occupies a plurality of backplane stages 410 when inserted in the rack 402. When inserted in the rack 402, a midplane (not shown) of the component 412 connects to at least one backplane stages 410 in the same or equivalent manner as does the midplane 406 of the component 404. Some elements of the backplane 12 remain unused in some of the backplane stages 410 that are located behind the component 412.

The backplane 12 includes a power and data section 414 located at an opposite end of the backplane 12 from the section 66 where the liquid adaptor 72 of the component 404 is connected. In each backplane stage 410, the power and data section 414 includes a backplane power connector 416 and a backplane data connector 418. The backplane power connector 416 is connectable to a component power connector (shown on a later Figure) mounted on the midplane 406 that is, in turn, mounted on the main board 408 of the component 404. The backplane data connector 418 is connectable to a component data connector (shown on a later Figure), also mounted on the midplane 406 of the component 404. These power and data connections are realised when the component 404 is inserted in one of the rack/backplane stages 410 of the rack 402.

The rack 404 includes a rear section 420 located behind the backplane 12. A plurality of ventilators 422 (schematically represented as square boxes on FIG. 18) is mounted to the backplane 12 and provides cooling ventilation to the system 400 via circular openings 424 formed in the backplane 12.

The rear section 420 also holds a power panel 426. The power panel 426 comprises a plurality of power stages 428. Each power stage 428 of the power panel 426 is electrically connected, for example via wires (not shown), to the backplane power connector 416 of a corresponding backplane stage 410 of the backplane 12.

Figure 19:
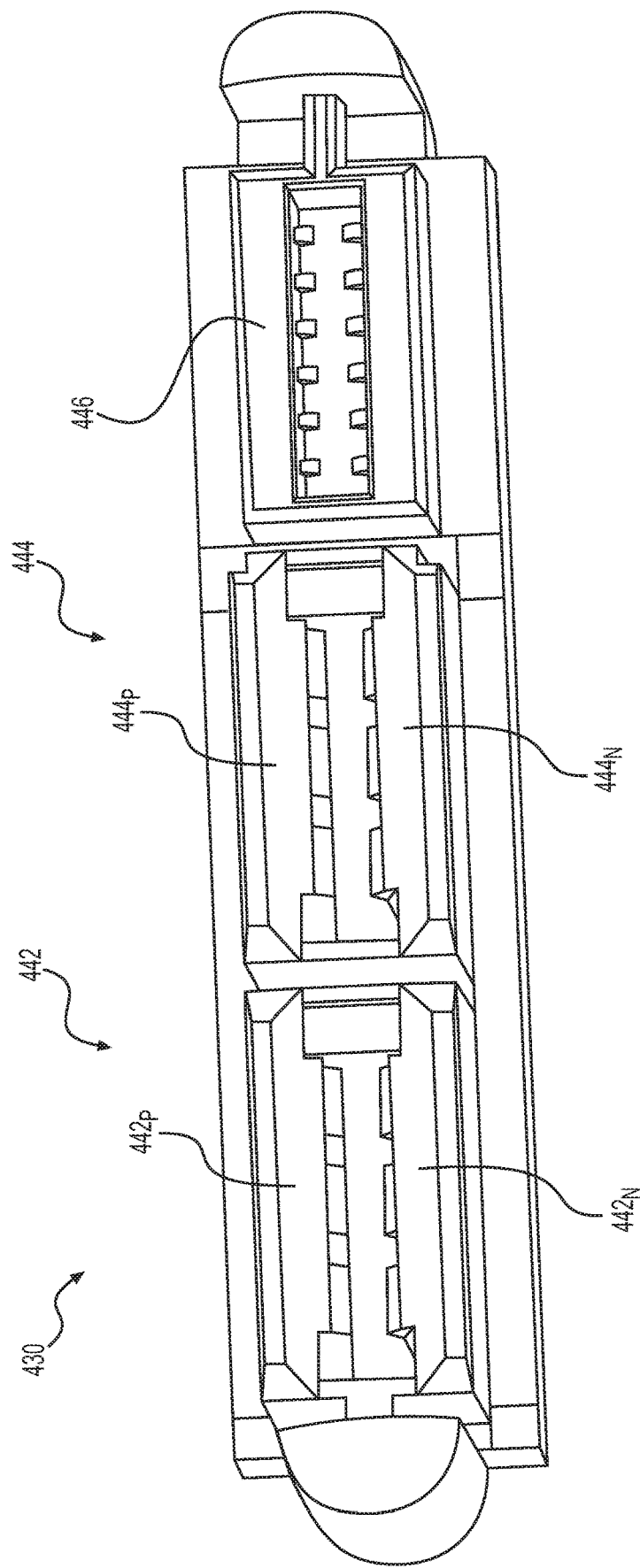
FIG. 19 is a detailed view of a connector mounted on a power panel.
Figure 20:
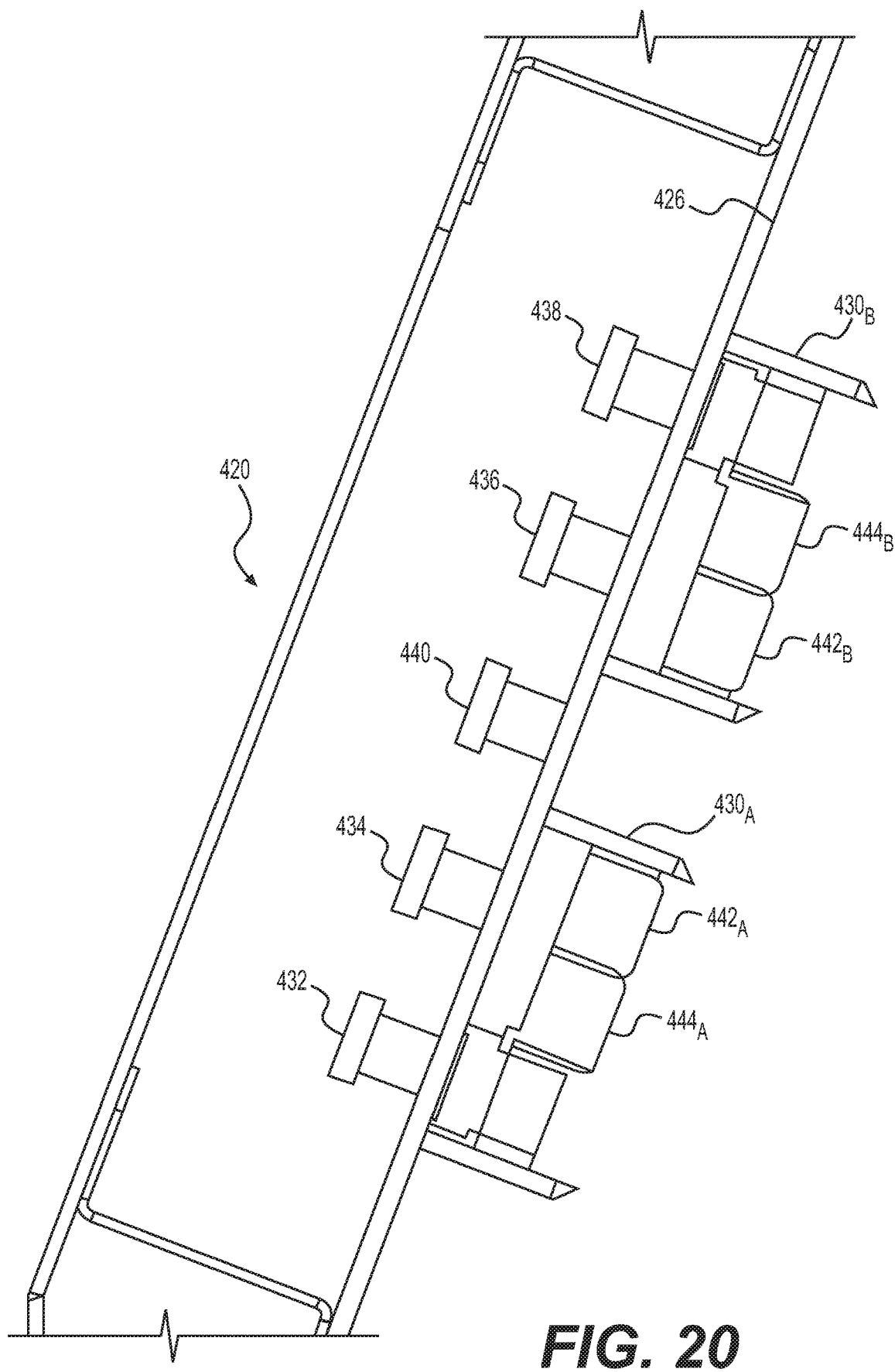
FIG. 20 is a top view of the power panel in accordance with an embodiment of the present technology.

FIG. 19 is a detailed view of a power connector 430 mounted on the power panel 426. The power connector 430 may be, in a non-limiting example, a Molex 0461144120 connector or an equivalent connector. Each power connector 430 mounted on the power panel 426 includes, on an input side 442, a phase input $442_P$ and a neutral input $442_N$. Each power connector 430 also includes, on an output side 444, a phase output $444_P$ and a neutral output $444_N$. Each power connector 430 further includes a data port 446. FIG. 20 is a top view of the power panel 426 in accordance with an embodiment of the present technology. The system 400 receives power from a sector (not shown) or from uninterruptible power supplies (UPS) (not shown) on two (2) distinct power lines A and B. Line A has a phase A connected to a first bus bar 432 and a neutral A connected to a second bus bar 434. Line B has a phase B connected to a third bus bar 436 and a neutral B connected to a fourth bus bas 438. A fifth bus bar 440 is connected to ground for safety purposes. Two (2) complementary power connectors $430_A$ and $430_B$ are mounted on each given power stage 428. As shown on FIG. 20, an input side $442_A$ of the power connector $430_A$ is connected to the first and second bus bars 432 and 434 to allow a connection of one of the backplane power connectors 416 to phase A and neutral A of the first line via the output side $444_A$ of the power connector $430_A$. An input side $442_B$ of the power connector $430_B$ is connected to the third and fourth bus bars 436 and 438 to allow a connection the same backplane power connector 416 to phase B and neutral B of the second line via the output side $444_B$ of the power connector $430_B$. In an embodiment, a total voltage between phases A and B is 230 VAC, +/−5%.

Although not mandatory, the two (2) complementary power connectors 430 of a same power stage 428 of the power panel 426 should be connected a same backplane connector 416 in a corresponding stage 410 of the backplane 12.

Figure 21:
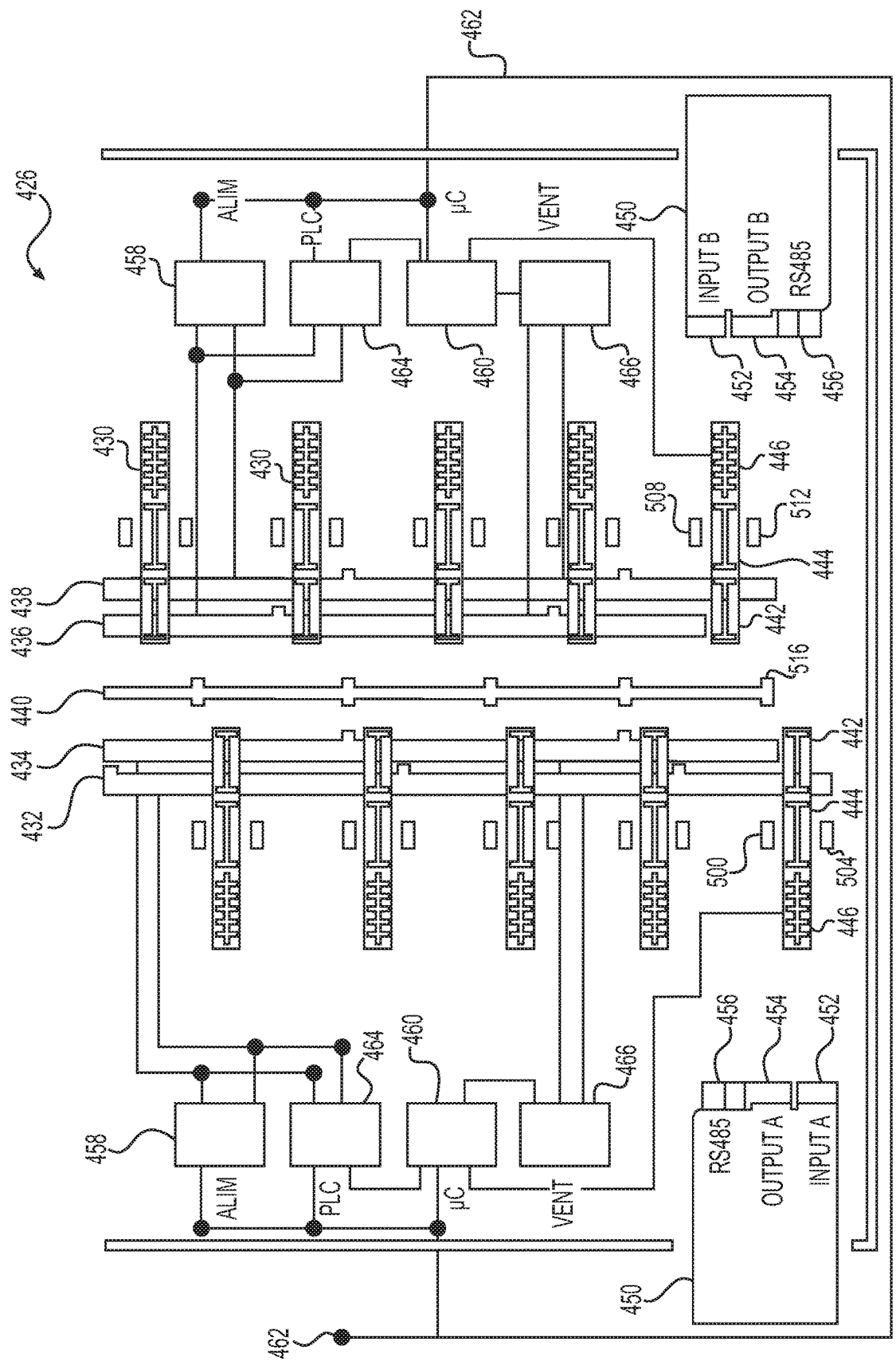
FIG. 21 is a schematic view of the power panel showing how smart breakers are connected thereto in accordance with an embodiment of the present technology.

FIG. 21 is a schematic view of the power panel 426 showing how smart breakers 450 are connected thereto in accordance with an embodiment of the present technology. In the context of the present technology, a smart breaker is a power control device that is configured to provide power to a component 404 while monitoring the power consumption of that component 404 in order to detect various abnormal conditions, for example overcurrent conditions, short-circuit conditions, and differential current faults. Two (2) smart breakers 450 are shown on FIG. 21, one each for the A and B sides of a given power stage 428 of the power panel 426. It should be understood that smart breakers 450 may be connected to each complementary power connector 430 in each power stage 428 of the system 400. Each smart breaker 450 comprises a power input 452 connectable to the input side 442 of a power connector 430, a power output side 454 connectable to the output side 444 of the power connector 430, and a data port 456 connectable to the data port 446 of the power connector 430. The data port 456 may be in the form of a RS485 connection. Power from one of the lines A or B is received at the power input 452 of the smart breaker 450 via the input side 442 of the power connector 430. Depending on conditions established within the smart breaker 450, power may be provided by the power output 454 of the smart breaker 450 to the output side 444 of the power connector 430 and, thereon, to a corresponding backplane power connector 416 of the backplane 12.

FIG. 21 also illustrates other elements of the system 400 that may, in an embodiment, be mounted on the power panel 426. As illustrated, each of these elements is present on both A and B sides of the power panel 426 for redundancy purposes; however, in an embodiment, a single one of each of these elements may be provided. One of these elements is a power supply 458 that is electrically connected to one of the lines A or B and that may be used to provide low voltage power, for example DC power, to various processing components of the system 400. Another element mounted on the power panel 426 is a main controller 460. The main controller 460 receives DC power from the power supply 458. The main controller 460 has data connections to the power connectors 430 and further to the smart breakers 450 when these are connected to the power connectors 430. An inter-integrated circuit (I²C) connection 462 also allows the main controller 460 to communicate with the backplane data connectors 418 on each backplane stage 410 of the backplane 12. When two (2) main controllers 460 are present, as in the example of FIG. 21, any one of the main controller 460 may assume an 'active' state while the other main controller 460 assumes a 'standby' state, being ready to take over the 'active' stage in case of failure of the other main controller 460. The present disclosure generally refers to 'the main controller 460' in the singular form for simplicity purposes, without any intent to limit the generality of the presentation. On each of the A and B sides, a power line communication (PLC) modem 464 is controlled by the main controller 460 and is connected to the phase and neutral of the A or B line. A ventilator controller 466 controls turning on or off of the ventilators 422, as directed by the main controller 460. In an embodiment, the main controllers 460 are connected to each other and to the data ports 446 of the power connectors 430, to the PLC modems 464, and to ventilator controllers 466 via universal asynchronous receiver-transmitter (UART) busses. A non-limiting example of the PLC modems 464 includes Maxim 79356 modems.

Figure 22:
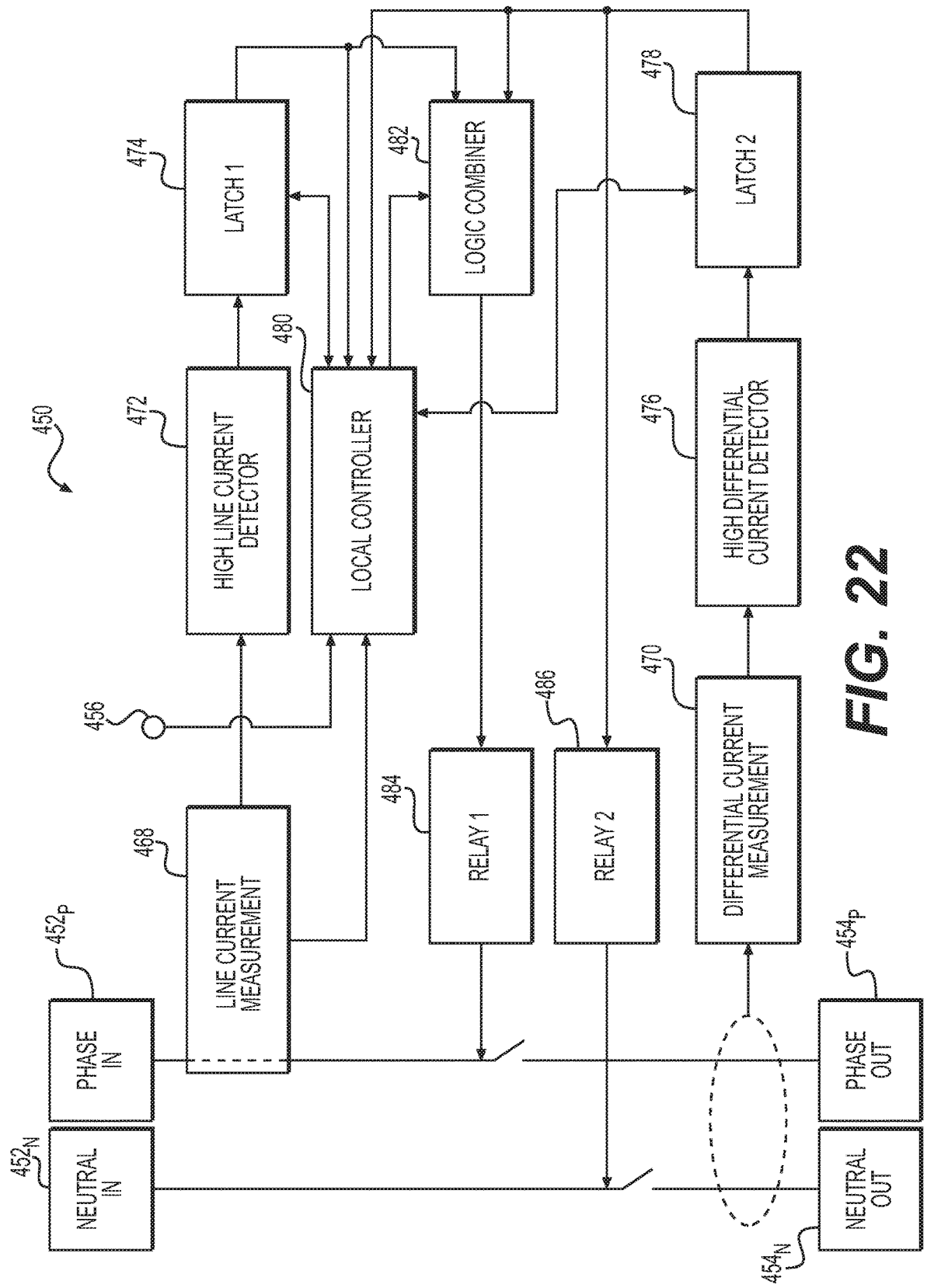
FIG. 22 is a high-level schematic circuit diagram of a smart breaker in accordance with an embodiment of the present technology.

FIG. 22 is a high-level schematic circuit diagram of a smart breaker 450 in accordance with an embodiment of the present technology. The power input 452 comprises a phase side $452_P$ connectable to the phase input $442_P$ of the power connector 430 and a neutral side $452_N$ connectable to the neutral input $442_N$ of the power connector 430. The power output 454 comprises a phase side $454_P$ connectable to the phase output $444_P$ of the power connector 430 and a neutral side $454_N$ connectable to the neutral output $444_N$ of the power connector 430. In the shown embodiment, the smart breaker 450 is capable of detecting a high line current on the A or B phase on which it is connected, the smart breaker 450 being also capable of detecting a differential current fault. A sensor 468 senses a line current flowing in the smart breaker 450 via the phase side $452_P$ of the power input 452. Another sensor 470 senses a difference between the line current and a neutral current returning from a load, i.e. from a component 404 mounted in the rack 402 and electrically connected to this smart breaker 450. A high line current detector 472 may detect that the sensor 468 reports that the line current is higher than a predetermined threshold and send a signal to a first latch 474. A high differential current detector 476 may detect that the sensor 470 reports a differential current that is higher than another predetermined threshold and send another signal to a second latch 478. A local controller 480 is informed of the statuses of the first and second latches 474 and 478. The local controller 480 also receives a line current measurement from the sensor 468 and forwards this measurement to the main controller 460 via the data port 456.

When the first latch 474 is set, its output is applied to a logic combiner 482 that causes the opening of a first relay 484 to disconnect the power output 454 from the power input 452, effectively disabling the smart breaker 450. When the second latch 478 is set, it causes the opening of a second relay 486, with the same effect. The local controller 480 may receive a rearm signal from the main controller 460 via the data port 456. In response to receiving the rearm signal, the local controller 480 may release the first and second latches 474 and 478, allowing closing of the first and second relays 484 and 486.

The smart breaker 450 may also be disabled by an action of the main controller 460, for example when the main controller 460 sends a power-off signal to the smart breaker 450. When the smart breaker 450 is initially inserted in the power connector 430 of the power plane, in the absence of a power-on signal from the main controller 460 the local controller 480 applies by default a disabling signal to the logic combiner 482, causing the opening of the first relay 484. The main controller 460 may then send a power-on signal received at the local controller 480, for example when the main controller 460 is informed of the insertion of the component 404 in the backplane stage 410 that corresponds to a location of the smart breaker 450 in the power panel 426. Having received the power-on signal, the local controller 480 sends an enabling signal to the logic combiner 482. As long as the first latch 474 is not set at that time, the logic combiner 482 will cause the closing of the first relay 484. Provided as well that the second latch 478 is not set, power will be available at the power output 454 of the smart breaker 450. In an embodiment, the main controller 460 may send a presence verification signal, for example a ping signal, to the smart breaker 450 before sending the power-on signal to the smart breaker 450. The power-on signal will in that case be provided conditionally to the local controller 480 responding to the main controller with a presence confirmation signal.

Returning to FIG. 21, one ventilator controller 466 is powered by the line A and the other ventilator unit is powered by the line B. The ventilators 422 are assembled in two (2) ventilator units mounted on the backplane 12 and electrically connected to both sides A and B of the power panel 426. The ventilators 422 that are electrically connected to line A are controlled by the ventilator controller 426 that is also powered by the line A. Similarly, the ventilators 422 that are electrically connected to line B are controlled by the ventilator controller 426 that is also powered by the line B.

Figure 16:
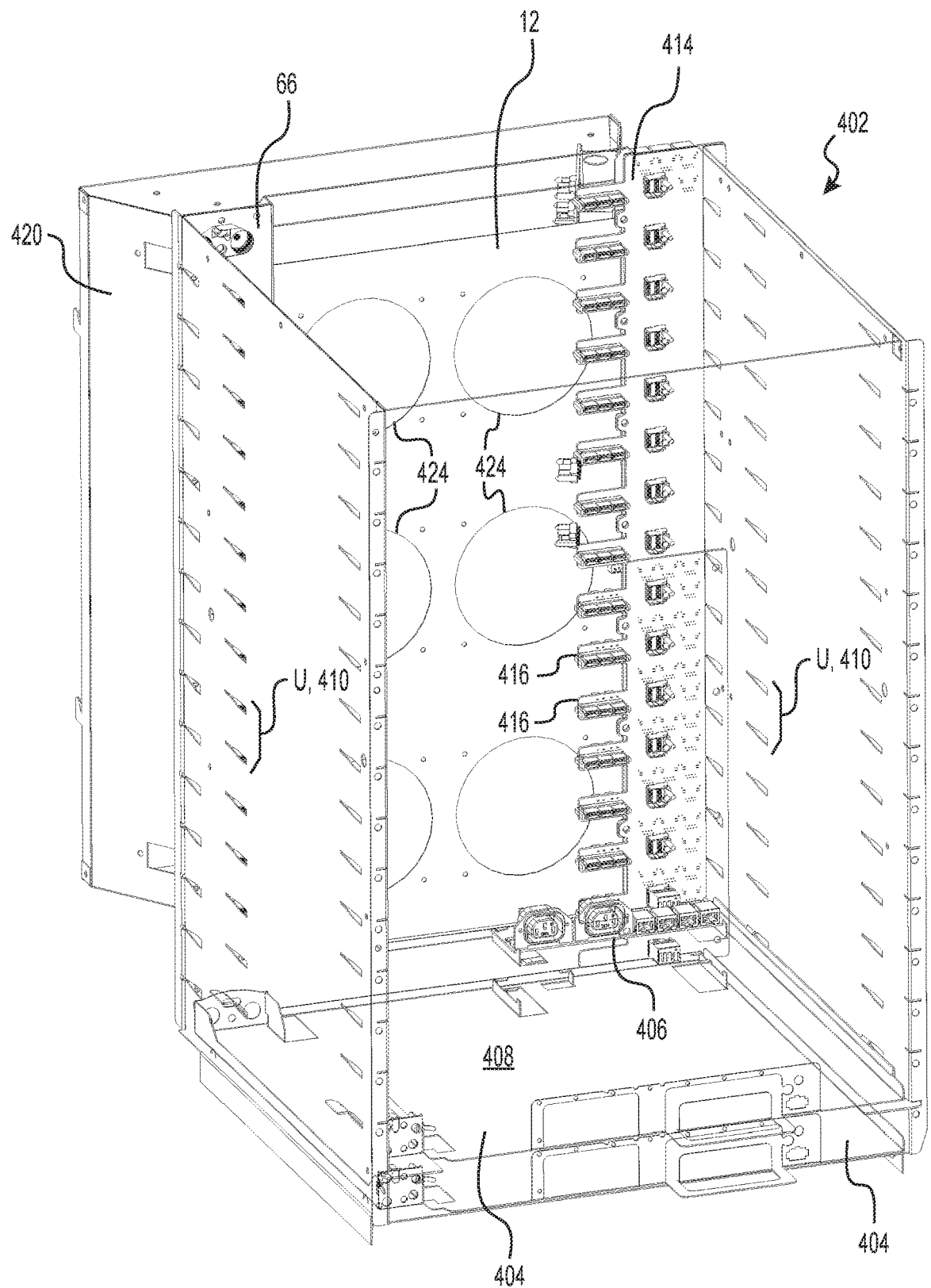
FIG. 16 is a front perspective view taken from another angle of the rack of FIG. 15 in accordance with an embodiment of the present technology.
Figure 17:
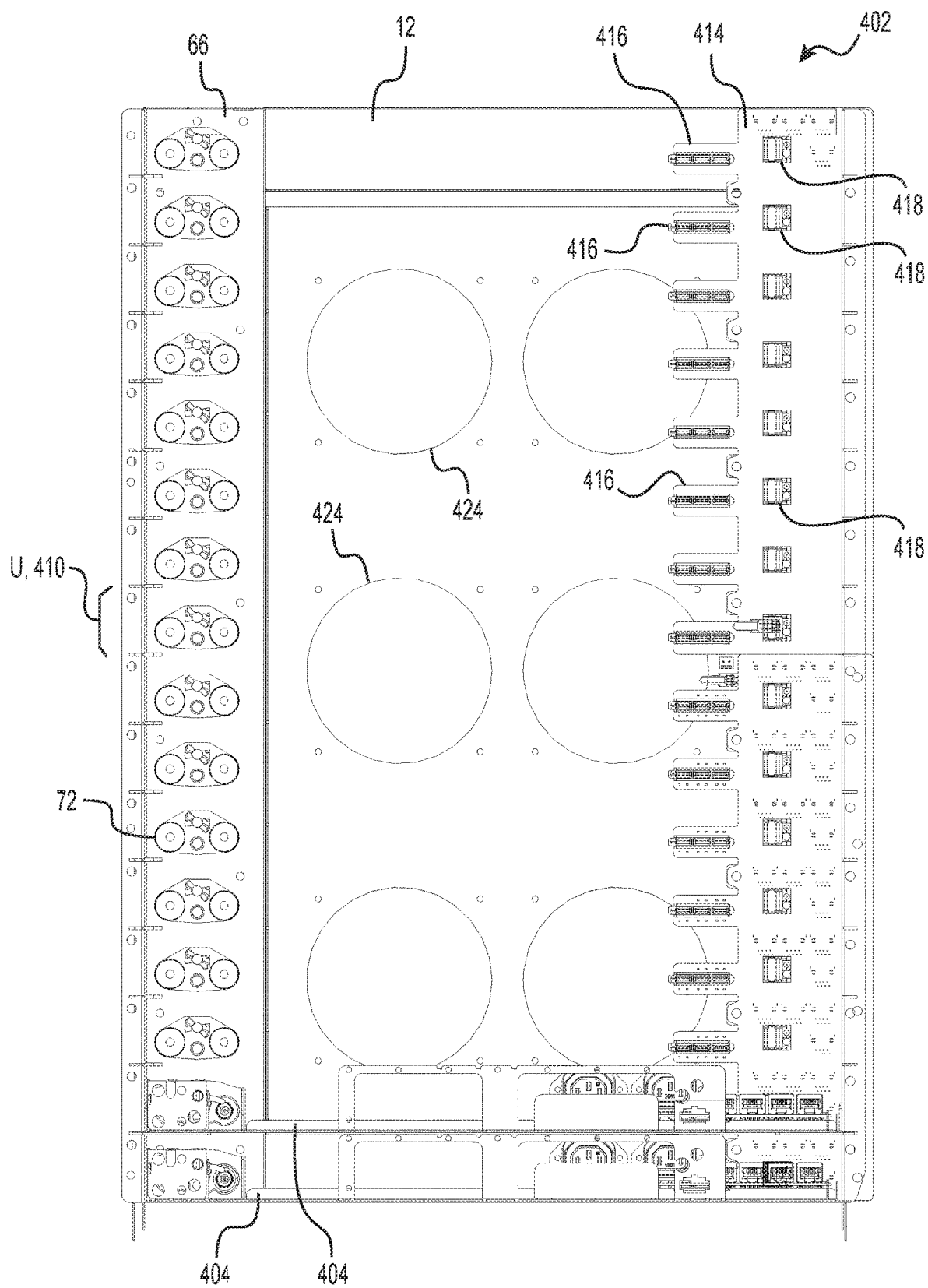
FIG. 17 is a front elevation view of the rack of FIG. 15 in accordance with an embodiment of the present technology.
Figure 18:
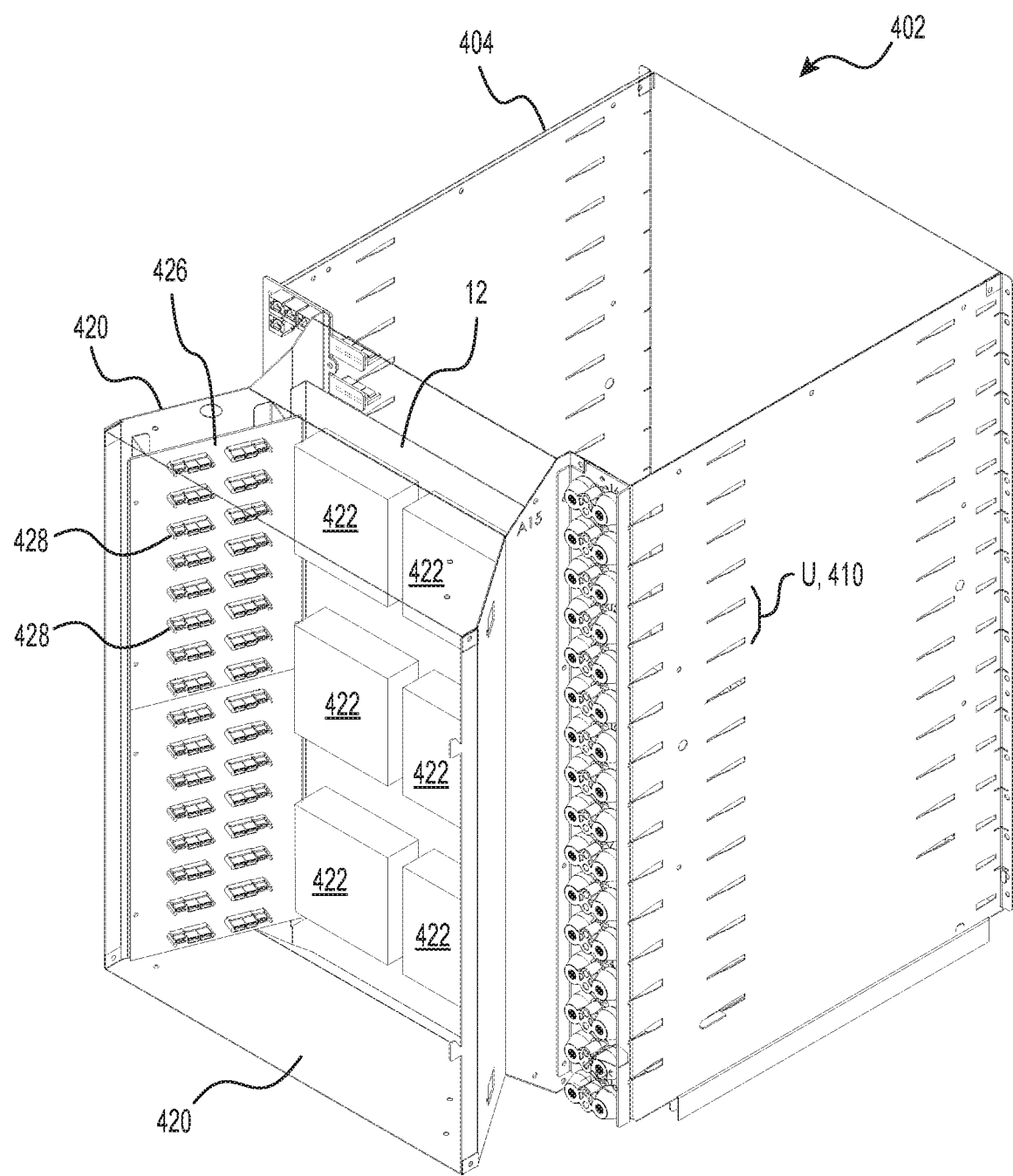
FIG. 18 is a rear perspective view taken from another angle of the rack of FIG. 15 in accordance with an embodiment of the present technology.

Each ventilator unit includes three (3) ventilators 422 in the example of FIGS. 16 to 18, although smaller or larger numbers of ventilators 422 may be included in each ventilator unit. The ventilator controllers 466 are operatively connected to the main controller 460. The main controller 460 is configured to cause the ventilator controllers 466 to turn on the ventilator unit when at least one component 404 is inserted in any backplane stage 410 of the rack 402.

One ventilator unit may be construed as being redundant to the other ventilator unit. The ventilator controllers 466 are configured to cause the ventilators 422 of the ventilator unit and of the redundant ventilator unit to rotate at an intermediate rate, for example 70% of their maximum rate, when all ventilators 422 of the ventilator unit and of the redundant ventilator unit are in operation. The ventilator controllers 466 are configured to cause the ventilators 422 of the ventilator unit and of the redundant ventilator unit to rotate at an accelerated rate, for example at their maximum rate, when at least one ventilator 422 of the ventilator unit and of the redundant ventilator unit is not in operation. The ventilator controllers may use pulse width modulation (PWM) to control the rotation of the ventilators 422 of the ventilator unit and of the redundant ventilator unit.

Figure 27:
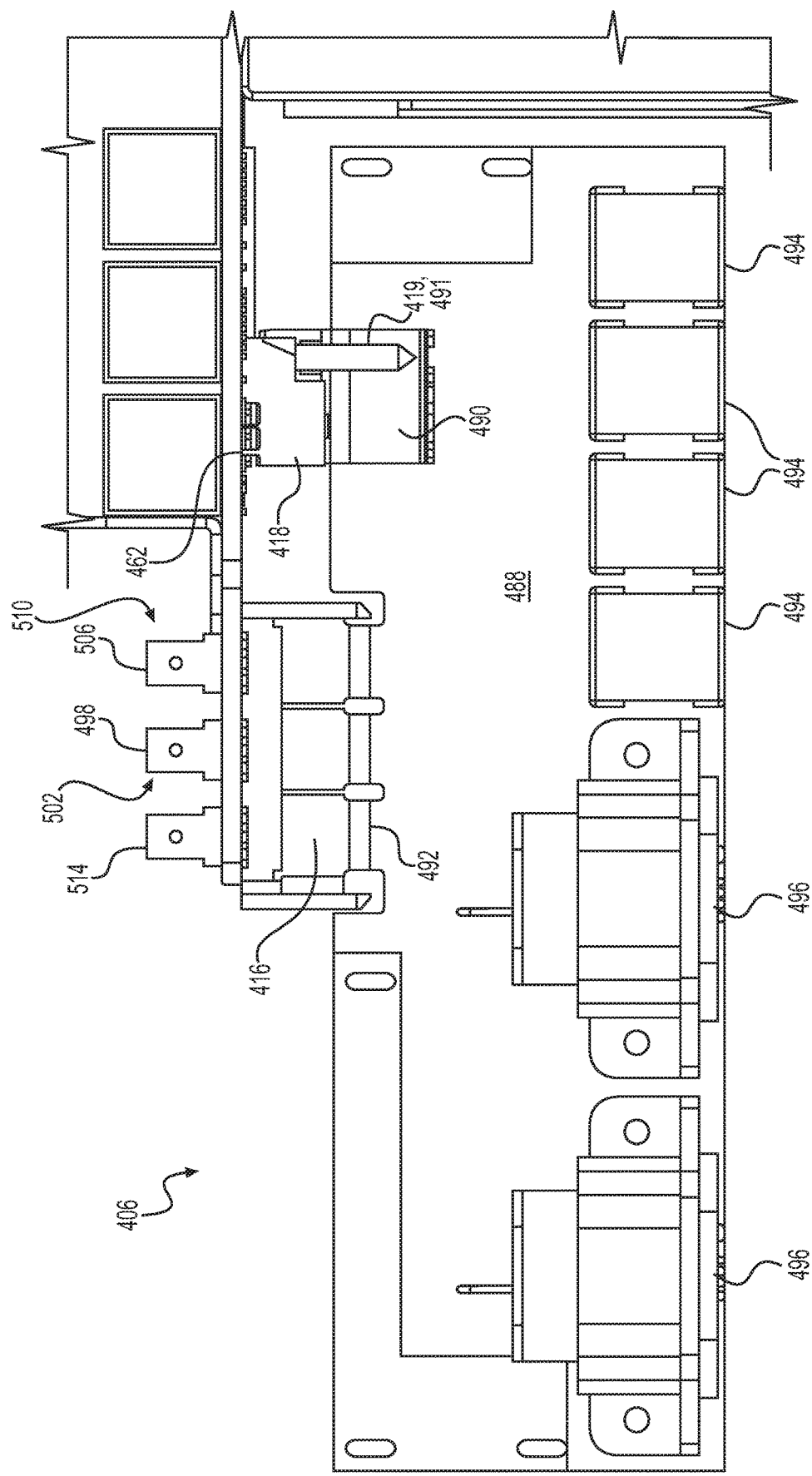
FIG. 27 is a top plan detailed view showing a connection of the midplane to the backplane in accordance with an embodiment of the present technology.

FIG. 23 is a front perspective view of a midplane 406 in accordance with an embodiment of the present technology. FIG. 24 is a rear perspective view of the midplane 406 of FIG. 23 in accordance with an embodiment of the present technology. FIG. 25 is a detailed view of a backplane power connector 416 mounted on a backplane 12. FIG. 26 is a perspective detailed view showing a connection of the midplane 406 to the backplane 12 in accordance with an embodiment of the present technology. FIG. 27 is a top plan detailed view showing a connection of the midplane 406 to the backplane 12 in accordance with an embodiment of the present technology. The midplane 406 includes a board 488 that supports various active elements and connectors of the midplane 406. The midplane 406 includes a component data connector 490 and a component power connector 492. The component data connector 490 comes in contact with the backplane data connector 418 of a given backplane stage 410 when the component 404 is inserted in the rack 402. At the same time, the component power connector 492 comes in contact with the backplane power connector 416 of the same backplane stage 410. The backplane power connector 416 may, in a non-limiting embodiment, be a Molex 46112-603 connector or an equivalent connector. In a non-limiting example, the backplane data connector 418 may be a Molex 76165-3304 or an equivalent connector and the component data connector 490 may be a Molex 76170-3036 connector or an equivalent connector. In one embodiment, the backplane data connector 418 may include a stud 419 that is insertable in an aperture 491 of the component data connector 490. The stud 419 and the aperture 491 facilitate the alignment of the midplane 406 on the data section 414 of the backplane and, further, facilitate the alignment of the component 404 in the rack 402. Jointly with the liquid adaptor 72 and its connection in the section 66 of the backplane 12, the stud 419 and the aperture 491 provide the same or equivalent mechanical alignment features as the male connectors 30, 32 and the female connectors 34, 36 of earlier Figures.

The component data connector 490 is connected to data plugs 494, for example RJ45 connectors, via internal traces (not shown) within the board 488. The component power connector 492 is connected to electric plugs 496 via internal traces (not shown) within the board 488. An electronic device mounted on the component 404, for example the non-standard size component 50 introduced in the description of FIGS. 4 and 5, may receive power via one or both of the electric plugs 496 and may have data connections to one or more of the data plugs 494. The I$^2$C connection 462 to the main controller 460 of the power panel 426 reaches the component data connector 490 via the backplane data connector 418 so that the main controller 460 may be placed in contact with the midplane 406.

When the component 404 is inserted in a given one of the plurality of backplane stages 410, the backplane data connector 418 of that backplane stage 410 emits a signal due to the fact that the backplane data connector 418 of that backplane stage 410 becomes connected to the component data connector 490 of the inserted component 404. This signal is received by the main controller 460 that thus detects the insertion of the component 404 in the given backplane stage 410 of the rack 402. The main controller 460 acquires a set of power parameters of the component 404 via the backplane data connector 418. In an embodiment, the main controller 460 uses the I$^2$C connection 462 to read the set of power parameters from a memory mounted on the midplane 406, for example an EEPROM 540 (FIG. 28), via the backplane data connector 418 and via the component data connector 490. The main controller 460 then causes the power panel 426 to provide power to the backplane power connector 418 of the backplane stage 410 in which the component 404 is inserted according to the set of power parameters of the component 404. The set of power parameters may include, for example an expected power consumption of the component 404 and an indication that the component 404 uses a single or dual power supply. Other parameters that may be read from the EEPROM 540 include, for example, a name, an IP address and/or a MAC address of a server mounted on the component 404, a serial number of the server, and a height of the component 404 expressed in a number of rack units U.

As shown for example on FIG. 21, the main controller 460 may be connected to each of the power stages 428 of the power panel 426. In a variant, some power connectors 430 that are connected to the bus bars 432 and 434 of line A are directly connected to one main controller 460 and other power connectors 430 that are connected to the bus bars 436 and 438 of line B are directly connected to another main controller 460. The two main controllers 460 share the same I$^2$C connection 462 so that all power connectors 430 are operatively connected to both main controllers 460.

Prior to causing the power panel 426 to provide power to the backplane power connector 416 of a given backplane stage 410 via the power stage 428 electrically connected to that backplane stage 410, the main controller 460 may send a presence verification signal to the smart breaker 450 that is connected to that power stage 428. The main controller 460 may then send a power-on signal to that smart breaker 450 after having received a presence confirmation signal from that smart breaker 450.

If the set of power parameters of the component 404 specifies a single power supply, the main controller 460 may cause the power panel 426 to provide power to the backplane power connector 416 of the given backplane stage 410 via one of the complementary power connectors 430 of the power stage 428 corresponding to the given backplane stage 410. The main controller 460 may alternatively cause the power panel 426 to provide power to the backplane power connector 416 of the given backplane stage 410 via both of the complementary power connectors 430 of the power stage 428 corresponding to the given backplane stage 410 if the component 404 specifies a dual power supply.

As distinct components such as the component 404 may be inserted in distinct rack/backplane stages 410 of the rack 402, the main controller 460 is further configured to detect the insertion of each component in these distinct rack/backplane stages 410 and to cause the power panel 426 to independently provide power to each of the distinct components being inserted in the distinct rack/backplane stages 410. Power is supplied to each distinct component according to distinct sets of power parameters of the distinct components acquired via distinct data connectors 418 of distinct rack/backplane stages 410 in which the distinct components are inserted.

In the system 400, the main controller 460 may obtain, from the smart breakers 450 inserted in each distinct power stage 428, a measurement of a power consumption for each component such as the component 404 inserted in each rack/backplane stage 410. The main controller 460 may assemble the distinct power consumption measurements to form a power consumption mapping for the rack and cause the PLC modems 464 to transmit the power consumption mapping over the power lines A and/or B, for example to an operation management center of a datacenter.

In an embodiment, the main controller 460 (or both main controllers 460 operating in tandem) may assemble operational parameters of all components inserted in the rack 402 in a tabular form as shown in Table I. Table I relates to a non-limiting example in which the rack 402 has 16 rack/ backplane stages 410 numbered from 0 to 15 and various operational parameters are expressed in 16-bit words.

TABLE I

| Parameter Name | Stage 15 | Stage 14 | ... | Stage 0 |
|---|---|---|---|---|
| IsAllowed | Yes/No | Yes/No | ... | Yes/No |
| IsInserted | Yes/No | Yes/No | ... | Yes/No |
| IsOn | Yes/No | Yes/No | ... | Yes/No |
| SmartBreakerA | Present/Absent | Present/Absent | ... | Present/Absent |
| SmartBreakerB | Present/Absent | Present/Absent | ... | Present/Absent |
| MaxPower | MSB | MSB | ... | MSB |
| | ... | ... | ... | ... |
| | LSB | LSB | ... | LSB |
| ServerError | Yes/No | Yes/No | ... | Yes/No |
| ShortCircuit | Yes/No | Yes/No | ... | Yes/No |
| OverCurrent | Yes/No | Yes/No | ... | Yes/No |
| DifferentialLeakage | Yes/No | Yes/No | ... | Yes/No |
| NoBoot | Yes/No | Yes/No | ... | Yes/No |
| WaterCoolError | Yes/No | Yes/No | ... | Yes/No |
| FanErrorA | Channel A All Fans | Channel A Fan 3 | Channel A B Fan 2 | Channel A Fan 1 |
| FanErrorB | Channel B All Fans | Channel B Fan 3 | Channel B B Fan 2 | Channel B Fan 1 |

Table I defines the following parameters:

| | |
|---|---|
| IsAllowed | Indicates whether powering on a component inserted in a given rack/backplane stage 410 is allowed, this value being set by an operator of the system 400; |
| IsInserted | Indicates whether a component is inserted in that stage, this value is set to 'Yes' when the main controller 460 is informed of the insertion of the component 404 in that stage; |
| IsOn | Indicates whether the component inserted in that stage is powered on, this value is set to 'Yes' when the main controller 460 is informed by the corresponding smart breaker 450 that power is correctly delivered to the inserted component 404; |
| SmartBreakerA | Indicates whether the smart breaker in the power stage on side A is connected, this value being set when the main controller 460 receives the presence confirmation signal from the smart breaker 450 on the A side of that stage; |
| SmartBreakerB | Indicates whether the smart breaker in the power stage on side B is connected, this value being set when the main controller 460 receives the presence confirmation signal from the smart breaker 450 on the B side of that stage; |
| MaxPower | A measurement of a peak power consumed on that stage, expressed in a plurality of bits, for example 16 bits, from a most significant bit (MSB) to a least significant bit (LSB). |
| ServerError | Indicates whether an error or a fault is detected on a server inserted in a given stage. |
| ShortCircuit | Indicates whether a short circuit is detected by the high line current detector 472 of a smart breaker 450 for a given stage. |
| OverCurrent | Indicates whether a smart breaker 450 for a given stage detects that the measured power consumption of a component inserted in a given stage is higher than the expected power consumption of that component. |
| DifferentialLeakage | Indicates whether a smart breaker 450 for a given stage detects a differential current fault in a component inserted in a given stage. |
| NoBoot | This flag is set when a smart breaker 450 for a given stage detects that a server that should be turned on does not consume power. |
| WaterCoolError | This flag is set when a flowmeter (not shown) detects that a minimal liquid flow is not maintained in a liquid adaptor 72 for a given stage. |
| FanErrorA/B | These flags are not related to the various stages in the rack 402; they are set when one or more of ventilators 422 connected to lines A and B are not operational. |

The main controller 460 may cause the PLC modems 464 to transmit the power the entire contents of Table I, over the power lines A and/or B, to an operation management center of a datacenter. The PLC modems 464 may encrypt the information sent over the power lines A and/or B, for example using the Advanced Encryption Standard (AES) 256.

Figure 28:
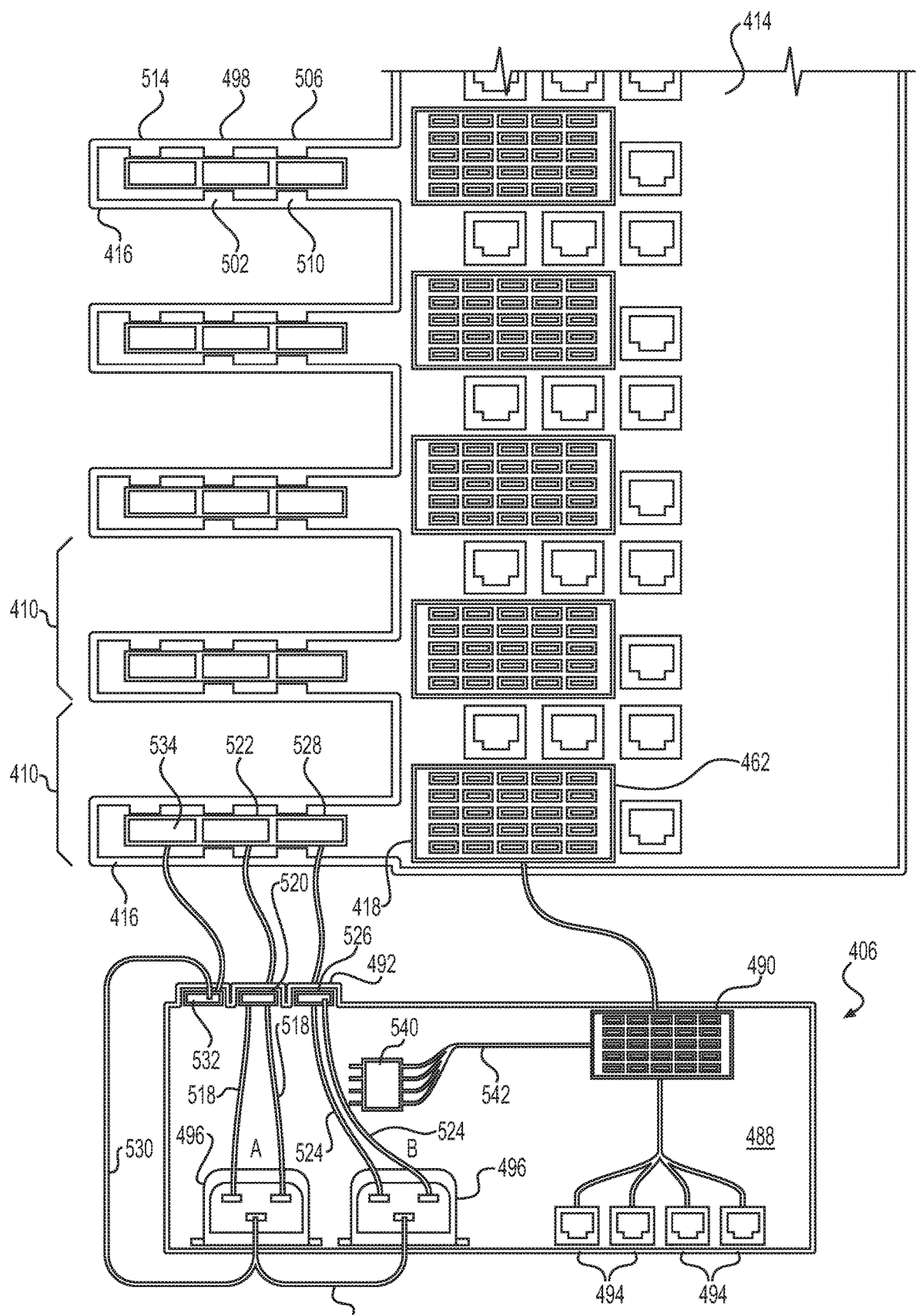
FIG. 28 is a schematic view showing electrical and data connections between the midplane and the backplane in accordance with an embodiment of the present technology.

FIG. 28 is a schematic view showing electrical and data connections between the midplane and the backplane in accordance with an embodiment of the present technology. Each backplane data connector 416 has five (5) connection points. For the backplane power connector 416 of a given backplane stage 410, a first connection point 498 is connected by wire (not shown) to a pin 500 (FIG. 21) that is in turn connected within the power panel 426 to the phase output $444_P$ of a power connector 430 of a corresponding power panel stage 428. Considering the same backplane power connector 416 and the same stages, a second connection point 502 is connected to a pin 504 that is in turn connected to the neutral output $444_N$. A third connection point 506 is connected to a pin 508 that is in turn connected to the phase output $444_P$ of a complementary power connector 430 and a fourth connection point 510 is connected to a pin 512 that is in turn connected to the line output $444_N$ of the complementary power connector 430. Finally, a fifth connection point 514 is connected to a pin 516 that is connected to the ground bus bar 440. One of the electric plugs 496 is connected to line A via internal leads 518 of the board 488 that reach a tab 520 of the component power connector 492, which is adapted to be inserted in a position 522 of the backplane power connector 416, thereby being connected on one side thereof to the pin 498 and on an opposite side to the pin 502 and further to the phase and neutral of line A. The other electric plug 496 is connected to line B via internal leads 524 of the board 488 that reach a tab 526 of the component power connector 492, which is adapted to be inserted in a position 528 of the backplane power connector 416, thereby being connected on one side thereof to the pin 506 and on an opposite side to the pin 510 and further to the phase and neutral of line B. Both electric plugs 496 have a ground connection connected via internal leads 530 to a tab 532 of the component power connector 492, which is adapted to be inserted in a position 534 of the backplane power connector, thereby being connected to the pin 514 and further to the ground bus bar 440.

The EEPROM 540 is mounted to the midplane 406, more specifically on the board 488. An internal lead 542 of the board 488 links the EEPROM 540 to the component data connector 490. Given that the I²C connection 462 is established from the main controller 460 of the power panel 426 up to the component data connector 490, the main controller 460 can read information related tot he midplane 406 and to the component 404 from the EEPROM 540.

Figure 29A:
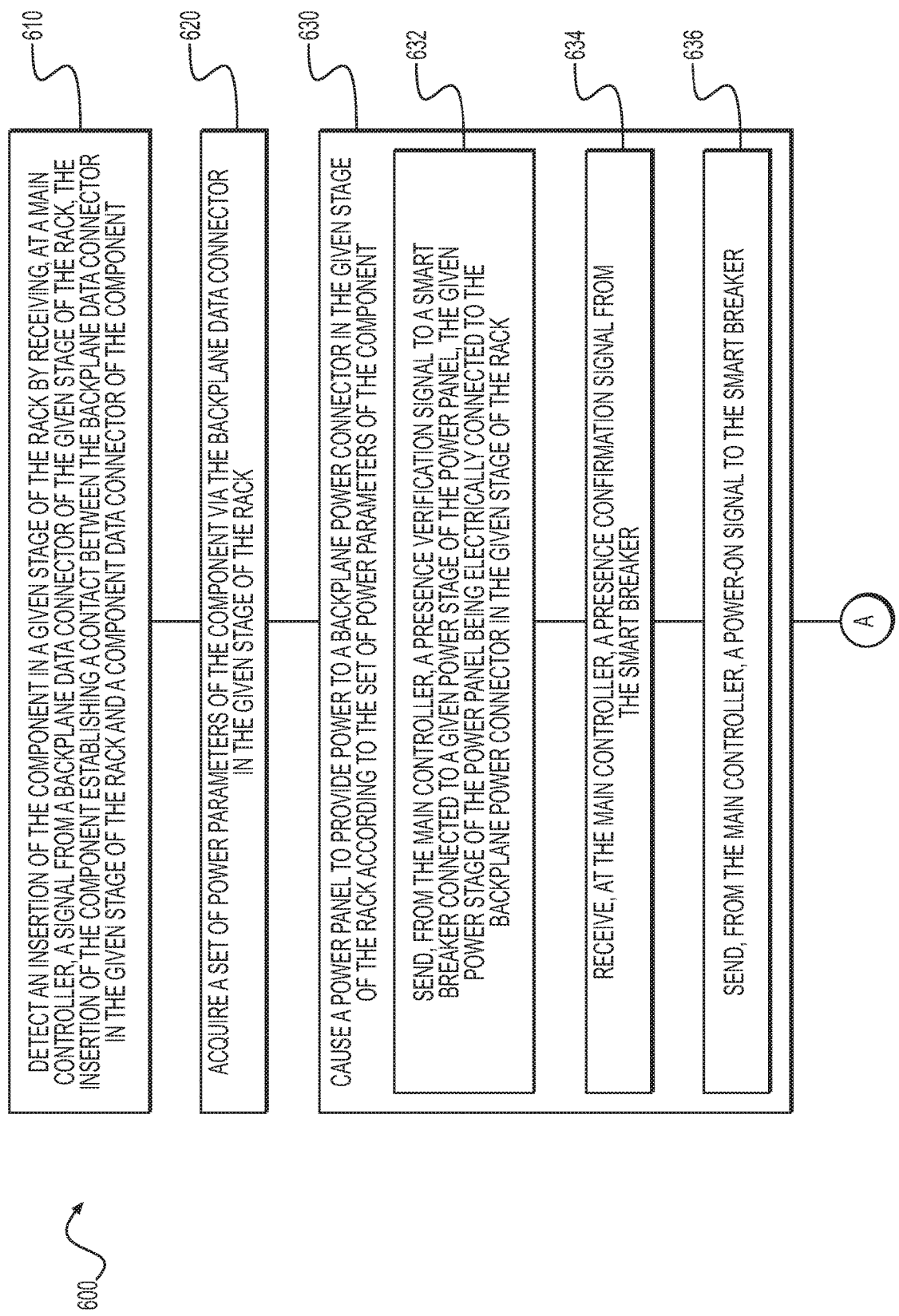
FIGS. 29A and 29B is a sequence diagram of a method of providing power to a component received in a rack in accordance with an embodiment of the present technology.
Figure 29B:
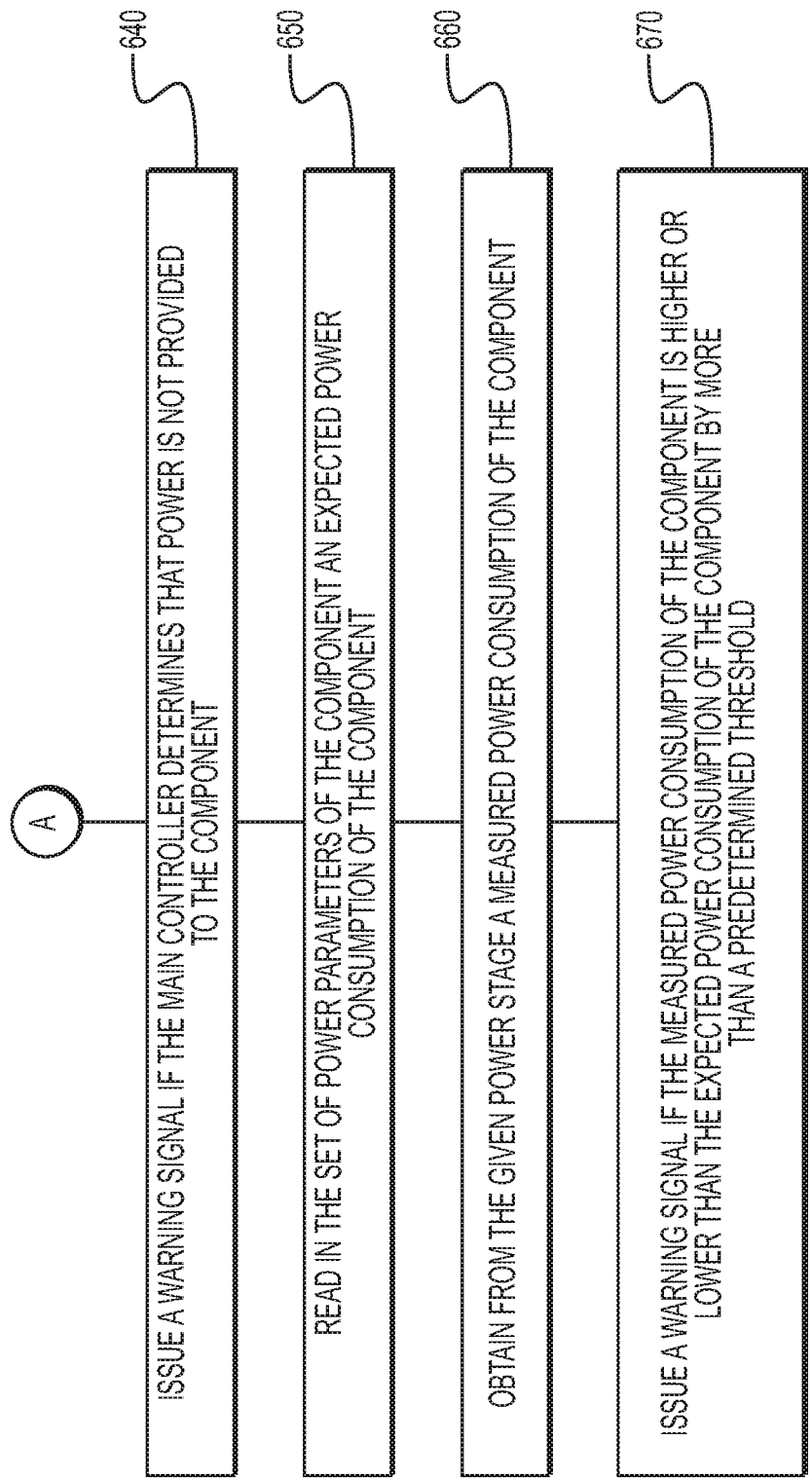

FIGS. 29A and 29B is a sequence diagram of a method of providing power to a component received in a rack in accordance with an embodiment of the present technology. On FIGS. 29A and 29B, a sequence 600 comprises a plurality of operations that may be executed in variable order, some of the operations possibly being executed concurrently, some of the operations being optional. At operation 610, an insertion of the component 404 in a given stage of the rack 402 is detected by receiving, at the main controller 460 a signal from the backplane data connector 418 of a given backplane stage 410 of the rack 402. This insertion of the component 404 in the rack 402 establishes a contact between the backplane data connector 418 in the given rack/backplane stage 410 of the rack 402 and the component data connector 490 of the component 404. A set of power parameters of the component 404 is acquired by the main controller 460 via the backplane data connector 418 in the given stage 410 of the rack 402 at operation 620. The set of power parameters, including for example an expected power consumption of the component 404 and an indication that the component 404 uses a single or dual power supply, may be obtained from the EEPROM 540. Other parameters that may be read from the EEPROM 540 include, for example, a name, an IPv6 and/or an IPv4 address, and a MAC address of a server mounted on the component 404. Another parameter that may be read from the EEPROM 540 indicates whether the component 404 occupies one or more of the rack/backplane stages 410 of the rack 402, the height of the component being expressed in a number of rack units U. Considering for example the component 412 of FIG. 15, which has a height of about four (4) rack units, a parameter read from the EEPROM 540 may indicate to the main controller 460 that a first, lowest position within four (4) rack/backplane stages 410 occupied by the component 412 may have a component power connector 492 and that other positions occupied by the component 412 do not include any component power connector 492. It would not be useful in such a case to mount smart breakers 450 in corresponding second, third and fourth power stages 428 of the power panel 426. If smart breakers 450 are nevertheless mounted in all power stages 428 of the power panel 426, it would not be useful in the same example to energize the smart breakers 450 connected to the second, third and fourth power stages 428 of the power panel.

At operation 630, the power panel 426 is caused to provide power to the backplane power connector 416 in the given stage 410 of the rack 402, the power being provided in accordance to the set of power parameters of the component 404. For example, depending on the dual or single power supply specification provided by the EEPROM 540, power may become available on one or both of the electric plugs 496. In a single power supply case, the main controller 460 may energize a single one of the smart breakers 450 connected to the two (2) complementary power connectors 430.

In an embodiment, operation 630 may comprise sub-operations 632, 634 and 636. At sub-operation 632, the main controller 460 sends a presence verification signal, for example a ping signal, to the smart breaker 450 connected to the given power stage 428 of the power panel 426 that is electrically connected to the backplane power connector 416 in the given stage 410 of the rack 402. In the smart breaker 450, the local controller 480 receives this presence verification signal. The main controller 460 receives a presence confirmation signal from the local controller 480 of the smart breaker 450 at sub-operation 634. Then at sub-operation 636, the main controller 460 sends a power-on signal to the smart breaker 450. The power-on signal is also received by the local controller 480 that, in turn, provides an enabling signal to the logic combiner 482, causing the first relay 484 to close. At that time, the first latch 474 is not expected to be set given that given that the smart breaker 450 was inactive until that time. For the same reason, at that time, the second latch 478 is not expected to be set and the second relay 486 is expected to be closed.

A warning signal may be issued at operation 640 if the main controller 460 determines that power is not provided to the component 404, for example if the main controller 460 does not receive the presence confirmation signal from local controller 480 of the smart breaker 450 or if the smart breaker 450 detects that the component 404 does not consume any power. At operation 650, the main controller 450 may read an expected power consumption of the component 404 in the set of power parameters of the component 404 obtained from the EEPROM 540. A measured power consumption of the component 404 may be obtained at the main controller 460 from the given power stage 428 at operation 660. Optionally, operation 660 may take place following a predetermined delay after the provision of power to the backplane power connector 416 in the given stage 410 of the rack 402 at operation 630. This optional delay allows to measure a stabilized power consumption of the component 404. In the illustrated embodiment, it is the local controller 480 of the smart breaker 450 inserted in the given power stage 480 that provides the power consumption measurement of the component 404 based on a current measurement obtained from the sensor 468. Then at operation 670, the main controller 460 may issue another warning signal if the measured power consumption of the component 404 is higher or lower than the expected power consumption of the component 404 by more than a predetermined threshold. Another warning signal may be issued by the main controller 460 if the component 404 specifies a dual power supply and if only one of the electric plugs 496 is energized through, for example, the inactivation of one of the smart breakers 450 in the related power stage 428. In an embodiment, the main controller 460 may cause any one of these warning signals may be issued over the power line A and/or over the power line B using the PLC modems 464 and the PLC protocol. The warnings may be received at an operation management center (not shown) of a datacenter in which the system 400 is installed.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each embodiment of the present technology.

As such, the methods and systems implemented in accordance with some non-limiting embodiments of the present technology can be represented as follows, presented in numbered clauses.

Clauses

[Clause 1] A rack adapted for receiving a component, comprising:

a backplane having a plurality of backplane stages, each backplane stage including a backplane power connector and a backplane data connector, the backplane power connector and the backplane data connector being respectively connectable to a component power connector and to a component data connector of the component when the component is inserted in the backplane stage;

a power panel; and a main controller operatively connected the power panel and to the backplane data connector of each of the plurality of backplane stages, the main controller being configured to:
  detect an insertion of the component in a given one of the plurality of backplane stages by receiving a signal emitted by the backplane data connector of the given backplane stage when the backplane data connector of the given backplane stage is connected to the component data connector,
  acquire a set of power parameters of the component via the backplane data connector of the given backplane stage, and
  cause the power panel to provide power to the backplane power connector of the given backplane stage according to the set of power parameters of the component.

[Clause 2] The rack of clause 1, wherein:
the power panel comprises a plurality of power stages, each power stage being electrically connected to the backplane power connector of a corresponding backplane stage;
the main controller is operatively connected to each of the power stages of the power panel; and
the main controller is further configured to cause the power panel to provide power to the backplane power connector of the given backplane stage via the power stage electrically connected to the given backplane stage by:
  sending a presence verification signal to a power control device connected to the power stage electrically connected to the given backplane stage;
  receiving a presence confirmation signal from the power control device; and sending a power-on signal to the power control device.

[Clause 3] The rack of clause 2, wherein each of the power stages of the power panel comprises two complementary power connectors that are both connected to the backplane power connector of the corresponding backplane stage, each of the two complementary power connectors being adapted to receive a corresponding power control device.

[Clause 4] The rack of clause 3, wherein, a first one of the complementary power connectors is fed by a first power line and a second one of the complementary power connectors is fed by a second power line.

[Clause 5] The rack of clause 4, wherein the main controller is further configured to:
  read in the set of power parameters of the component an information element indicating whether the component specifies a single or dual power supply;
  cause the power panel to provide power to the backplane power connector of the given backplane stage via one of the complementary power connectors of the power stage corresponding to the given backplane stage if the component specifies a single power supply; and
  cause the power panel to provide power to the backplane power connector of the given backplane stage via both of the complementary power connectors of the power stage corresponding to the given backplane stage if the component specifies a dual power supply.

[Clause 6] The rack of clause 4 or 5, wherein the main controller is further configured to:
  read in the set of power parameters of the component an expected power consumption of the component;
  obtain from the power stage connected to the given backplane stage a measured power consumption of the component; and
  issue a warning signal if the measured power consumption of the component is higher or lower than the expected power consumption of the component by more than a predetermined threshold.

[Clause 7] The rack of clause 6, wherein the main controller is further configured to obtain the measured power consumption of the component following a predetermined delay after causing the power panel to provide power to the backplane power connector of the given backplane stage.

[Clause 8] The rack of clause 6 or 7, further comprising a power line communication (PLC) modem operatively connected to the main controller and to at least one of the first and second power lines, the PLC modem being adapted to transmit the warning signal over the at least one of the first and second power lines.

[Clause 9] A system, comprising:
the rack and the component of any one of clauses 1 to 8;
wherein the component comprises:
  a main board,
  a midplane mounted on the main board, the component power connector and the component data connector being mounted on the midplane, and
  a memory operatively connected to the component data connector, the memory storing the set of power parameters of the component.

[Clause 10] The system of clause 9, wherein the component further comprises:
an electric plug mounted on the midplane and electrically connected to the component power connector;
a data plug mounted on the midplane and operatively connected to the component data connector; and
an electronic device mounted on the main board and connected to the electric plug and to the data plug.

[Clause 11] The system of clause 10, wherein:
the rack is adapted for insertion of standard-size boards;
the main board is a standard-size board; and
the electronic device comprises a non-standard-size board mounted on the main board.

[Clause 12] The system of any one of clauses 9 to 11, wherein:
the rack comprises a plurality of distinct rack stages adapted for receiving distinct components, each distinct rack stage corresponding to one of the backplane stages and to the power stage corresponding to the one of the backplane stages; and
the main controller is further configured to cause the power panel to independently provide power to each of the distinct components being inserted in the distinct rack stages according to distinct sets of power parameters of the distinct components acquired via distinct data connectors of distinct backplane stages corresponding to the distinct rack stages in which the distinct components are inserted.

[Clause 13] The system of clause 12, further comprising, a power line communication modem (PLC) operatively connected to the main controller and to a power line providing power to the power panel wherein the main controller is further configured to:
  obtain from the power stage distinct power consumption measurements for the distinct components inserted in the distinct rack stages;
  assemble the distinct power consumption measurements to form a power consumption mapping for the rack; and
  cause the PLC modem to transmit the power consumption mapping over the power line.

[Clause 14] A method for providing power to a component received in a rack, comprising:
  detecting an insertion of the component in a given stage of the rack by receiving, at a main controller, a signal from a backplane data connector of the given stage of the rack, the insertion of the component establishing a contact between the backplane data connector in the given stage of the rack and a component data connector of the component;
  acquiring a set of power parameters of the component via the backplane data connector in the given stage of the rack; and
  causing a power panel to provide power to a backplane power connector in the given stage of the rack according to the set of power parameters of the component.

[Clause 15] The method of clause 14, wherein causing the power panel to provide power to the backplane power connector in the given stage of the rack further comprises:
  sending, from the main controller, a presence verification signal to a power control device connected to a given power stage of the power panel, the given power stage of the power panel being electrically connected to the backplane power connector in the given stage of the rack;
  receiving, at the main controller, a presence confirmation signal from the power control device; and
  sending, from the main controller, a power-on signal to the power control device.

[Clause 16] The method of clause 15, further comprising issuing a warning signal if the main controller does not receive the presence confirmation signal from the power control device.

[Clause 17] The method of clause 15, further comprising:
  reading in the set of power parameters of the component an expected power consumption of the component;
  obtaining from the given power stage a measured power consumption of the component; and
  issuing a warning signal if the measured power consumption of the component is higher or lower than the expected power consumption of the component by more than a predetermined threshold.

[Clause 18] The method of clause 16 or 17, wherein the warning signal is issued over a power line electrically connected power panel to the using a power line communication protocol.

[Clause 19] A method of delivering power to a component mounted in a rack, comprising:
  following insertion of the component in the rack, detecting an initial contact established between at least one of two male connectors mounted to a backplane of the rack and at least one of two female connectors of the component;
  subsequent to the initial contact, detecting a full insertion of the two male connectors in the two female connectors;
  responsive to detecting the full insertion of the two male connectors in the two female connectors, delivering power from the backplane to the component via a first electrical connection between a first of the two male connectors and a corresponding first of the two female connectors and via a second electrical connection between a second of the two male connectors and a corresponding second of the two female connectors.

[Clause 20] The method of clause 19, wherein the two male connectors and the two female connectors are sized and configured to mechanically guide an alignment of the component in the rack following the initial contact.

[Clause 21] The method of clause 19 or 20, wherein:
  two additional redundant male connectors are mounted to the backplane; and
  the component has two additional redundant female connectors.

[Clause 22] The method of any one of clauses 19 to 21, wherein:
  the first electrical connection is a positive DC voltage connection; and
  the second electrical connection is a DC negative voltage connection.

[Clause 23] The method of any one of clauses 19 to 21, wherein:
  the first electrical connection is a line AC voltage connection; and
  the second electrical connection is a neutral connection.

[Clause 24] The method of any one of clauses 19 to 21 further comprising:
  detecting a type of the component inserted in the rack;
  wherein delivering power from the backplane to the component comprises delivering AC power or DC power depending on the detected type of the component.

[Clause 25] The method of clause 24, further comprising:
  sensing a level of power delivered from the backplane to the component;
  interrupting the delivery of power to the component when the power level exceeds a high power threshold;
  receiving a rearm command after interruption of the delivery of power to the component; and
  resuming the delivery of power to the component in response to receiving the rearm command.

[Clause 26] A rack adapted for receiving one or more components, comprising:
  a backplane;
  two male connectors mounted to the backplane;
  an electrical source connected to the two male connectors;
  a first detector of an initial contact established between at least one of the two male connectors and at least one of two female connectors of a component partially inserted in the rack;
  a second detector of a full insertion of the two male connectors in the two female connectors when the component is further inserted in the rack; and
  a controller operatively connected to the electrical source and to the first and second detectors, the controller being configured to cause the electrical source to start delivering power to the component inserted in the rack via a first electrical connection between a first of the two male connectors and a corresponding first of the two female connectors of the component inserted in the rack and via a second electrical connection between a second of the two male connectors and a corresponding second of the two female connectors inserted in the rack when the full insertion of the two male connectors in the two female connectors is detected.

[Clause 27] The rack of clause 26, further comprising:
  a pair of side panels extending from the backplane; and
  a support member mounted on each side panel, each support member being internal to the rack and configured to mate with a corresponding side edge of the component to mechanically guide an initial alignment of the component upon initial insertion of the component in the rack;
  wherein the two male connectors are sized and configured to mate with the two female connectors of the component to mechanically guide a final alignment of the component upon insertion in the rack.

[Clause 28] The rack of clause 27, wherein the rack defines a plurality of parallel stages, each respective stage being adapted for receiving a respective component, each respective stage comprising:
  a respective set of two male connectors mounted in the backplane and connected to the electrical source;
  a respective support member mounted on each of the side panels, each support member being internal to the rack and configured to mate with a corresponding side edge of the respective component to mechanically guide an initial alignment of the respective component upon initial insertion of the respective component in the respective stage;
  a respective first detector of an initial contact established between at least one connector of the respective set two male connectors and at least one connector of a respective set of two female connectors of the respective component inserted in the respective stage; and
  a respective second detector of a full insertion of the respective set of two male connectors in the corresponding set of two female connectors of the respective component inserted in the respective stage;
  wherein the controller is configured to cause the electrical source to start delivering power to the respective component inserted in each of the respective stages when, for each respective stage, the full insertion of the respective set of two male connectors in the respective set of two female connectors is detected.

[Clause 29] The rack of any one of clauses 26 to 28, wherein the first detector is configured to detect an electrical continuity between the at least one of the two male connectors mounted to the backplane of the rack and the at least one of the two female connectors of the component.

[Clause 30] The rack of any one of clauses 26 to 29, wherein the second detector comprises a backplane mounted part and a component mounted part that are sized and positioned so that they come in contact when the two male connectors are substantially fully inserted in the two female connectors.

[Clause 31] The rack of any one of clauses 26 to 30, wherein:
  the electrical source comprises an AC power source and a DC power source;
  at least one of the first and second detectors is configured to detect a type of the component; and
  the controller is further configured to cause the electrical power source to deliver AC power or DC power to the component depending on the detected type of the component.

[Clause 32] The rack of clause 31, further comprising:
  a switch operatively connected to the controller, to the AC power source and to the DC power source;
  wherein the least one of the first and second detectors is further configured to detect:
  a required polarity of the component when the component requires DC power, and
  a line input and a neutral input of the component when the component requires AC power; and
  wherein the controller is further configured to cause the switch to:
  when the component requires AC power, connect one of the two male connectors to a line output of the AC power source and connect an other of the two male connectors to a neutral output of the AC power source, in view of the line and neutral inputs of the component, and
  when the component requires DC power, connect one of the two male connectors to a positive output of the DC power source and connect an other of the two male connectors to a negative output of the DC power source, in view of the required polarity of the component.

[Clause 33] The rack of clause 32, further comprising:
  a sensor of a level of power delivered from the backplane to the component;
  a breaker operatively connected to the sensor and selectively connecting the switch to the two male connectors, the breaker being configured to:
  interrupt the delivery of power to the component when the sensor senses that the power level exceeds a high power threshold;
  receive, from the controller, a rearm command after interruption of the delivery of power to the component; and
  resume the delivery of power to the component in response to receiving the rearm command.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A rack adapted for receiving a component, comprising:
  a backplane having a plurality of backplane stages, each backplane stage including a backplane power connector and a backplane data connector, the backplane power connector and the backplane data connector being respectively connectable to a component power connector and to a component data connector of the component when the component is inserted in the backplane stage;
  a power panel comprising a plurality of power stages, each power stage being electrically connected to the backplane power connector of a corresponding backplane stage, each power stage being adapted to selectively receive a power control device configured to, in response to receiving a power-on signal, deliver power from a first power line to the backplane power connector of the corresponding backplane stage; and
  a main controller operatively connected to each of the power stages of the power panel, and to the backplane data connector of each of the plurality of backplane stages, the main controller being configured to:
    detect an insertion of the component in a given one of the plurality of backplane stages by receiving a signal emitted by the backplane data connector of the given backplane stage when the backplane data connector of the given backplane stage is connected to the component data connector,
    acquire a set of power parameters of the component via the backplane data connector of the given backplane stage, and
    cause the power panel to selectively provide power to the backplane power connector of the given backplane stage via the power stage electrically connected to the given backplane stage and according to the set of power parameters of the component, by:

sending a presence verification signal to the power control device of the power stage electrically connected to the given backplane stage;

receiving a presence confirmation signal from the power control device, the presence confirmation signal indicating that the power control device is present in the power stage and ready to provide power to the component; and in response to receiving the presence confirmation signal, sending the power-on signal to the power control device to allow the power control device to deliver power to the component power connector of the component.

2. The rack of claim 1, wherein:

each of the power stages of the power panel comprises two complementary power connectors that are both connected to the backplane power connector of the corresponding backplane stage, each of the two complementary power connectors being adapted to receive a corresponding power control device; and a first one of the complementary power connectors is fed by the first power line and a second one of the complementary power connectors is fed by a second power line.

3. The rack of claim 2, wherein the main controller is further configured to:

read in the set of power parameters of the component an information element indicating whether the component specifies a single or dual power supply;

cause the power panel to provide power to the backplane power connector of the given backplane stage via one of the complementary power connectors of the power stage corresponding to the given backplane stage if the component specifies a single power supply;

cause the power panel to provide power to the backplane power connector of the given backplane stage via both of the complementary power connectors of the power stage corresponding to the given backplane stage if the component specifies a dual power supply;

read in the set of power parameters of the component an expected power consumption of the component;

obtain from the power stage connected to the given backplane stage a measured power consumption of the component; and issue a warning signal if the measured power consumption of the component is higher or lower than the expected power consumption of the component by more than a predetermined threshold.

4. The rack of claim 3, wherein the main controller is further configured to obtain the measured power consumption of the component following a predetermined delay after causing the power panel to provide power to the backplane power connector of the given backplane stage.

5. A system, comprising the rack and the component of claim 1, wherein the component comprises:

a main board, a midplane mounted on the main board, the component power connector and the component data connector being mounted on the midplane, and a memory operatively connected to the component data connector, the memory storing the set of power parameters of the component.

6. The system of claim 5, wherein the component further comprises:

an electric plug mounted on the midplane and electrically connected to the component power connector;

a data plug mounted on the midplane and operatively connected to the component data connector; and an electronic device mounted on the main board and connected to the electric plug and to the data plug.

7. The system of claim 6, wherein:

the rack is adapted for insertion of standard-size boards;

the main board is a standard-size board; and the electronic device comprises a non-standard-size board mounted on the main board.

8. The system of claim 5, wherein:

the rack comprises a plurality of distinct rack stages adapted for receiving distinct components, each distinct rack stage corresponding to one of the backplane stages and to the power stage corresponding to the one of the backplane stages; and the main controller is further configured to cause the power panel to independently provide power to each of the distinct components being inserted in the distinct rack stages according to distinct sets of power parameters of the distinct components acquired via distinct data connectors of distinct backplane stages corresponding to the distinct rack stages in which the distinct components are inserted.

9. The system of claim 8, further comprising a modem operatively connected to the main controller and to a power line providing power to the power panel wherein the main controller is further configured to:

obtain from the power stage distinct power consumption measurements for the distinct components inserted in the distinct rack stages;

assemble the distinct power consumption measurements to form a power consumption mapping for the rack; and cause the modem to transmit the power consumption mapping over the power line.

10. A method for providing power to a component received in a rack, comprising:

detecting an insertion of the component in a given stage of the rack by receiving, at a main controller, a signal from a backplane data connector of the given stage of the rack, the insertion of the component establishing a contact between the backplane data connector in the given stage of the rack and a component data connector of the component, the insertion of the component further establishing a contact between a backplane power connector in the given stage of the rack and a component power connector of the component;

acquiring a set of power parameters of the component via the backplane data connector in the given stage of the rack; and causing a power panel to selectively provide power to the backplane power connector in the given stage of the rack according to the set of power parameters of the component by:

sending, from the main controller, a presence verification signal to a power control device selectively received in a given power stage of the power panel, the given power stage of the power panel being electrically connected to the backplane power connector in the given stage of the rack, the power control device being configured to, in response to receiving a power-on signal, deliver power from a power line to the backplane power connector of the given backplane stage, receiving, at the main controller, a presence confirmation signal from the power control device, the presence confirmation signal indicating that the power control device is present in the given power stage and ready to provide power to the component, and in response to receiving the presence confirmation signal, sending, from the main controller, the power-on signal to the power control device to allow the power control device to deliver power to the component power connector of the component.

11. The method of claim 10, further comprising issuing a warning signal if the main controller does not receive the presence confirmation signal from the power control device.

12. The method of claim 10, further comprising:
reading in the set of power parameters of the component an expected power consumption of the component;
obtaining from the given power stage a measured power consumption of the component; and
issuing a warning signal if the measured power consumption of the component is higher or lower than the expected power consumption of the component by more than a predetermined threshold.

13. The method of claim 10, further comprising issuing a warning signal if the power control device detects that the component does not consume power.

* * * * *